(12) United States Patent
Khlat

(10) Patent No.: US 12,107,619 B2
(45) Date of Patent: Oct. 1, 2024

(54) SWITCHABLE RF TRANSMIT/RECEIVE MULTIPLEXER

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 18/355,705

(22) Filed: Jul. 20, 2023

(65) Prior Publication Data

US 2023/0370109 A1 Nov. 16, 2023

Related U.S. Application Data

(63) Continuation of application No. 16/358,843, filed on Mar. 20, 2019, now abandoned, which is a continuation of application No. 14/926,116, filed on Oct. 29, 2015, now Pat. No. 10,312,960, which is a continuation-in-part of application No. 14/824,937, filed on Aug. 12, 2015, now Pat. No. 9,780,866.

(60) Provisional application No. 62/073,096, filed on Oct. 31, 2014, provisional application No. 62/036,210, filed on Aug. 12, 2014.

(51) Int. Cl.
| | | |
|---|---|---|
| *H04B 1/44* | (2006.01) | |
| *H04B 1/00* | (2006.01) | |
| *H04L 5/14* | (2006.01) | |
| *H03H 7/46* | (2006.01) | |
| *H03H 11/34* | (2006.01) | |
| *H04L 5/00* | (2006.01) | |

(52) U.S. Cl.
CPC .............. *H04B 1/44* (2013.01); *H04B 1/006* (2013.01); *H04L 5/14* (2013.01); *H03H 7/465* (2013.01); *H03H 11/344* (2013.01); *H04L 5/001* (2013.01)

(58) Field of Classification Search
None
See application file for complete search history.

(56) References Cited

U.S. PATENT DOCUMENTS

| | | |
|---|---|---|
| 5,408,679 A | 4/1995 | Masuda |
| 5,715,525 A | 2/1998 | Tarusawa et al. |
| 7,636,554 B2 | 12/2009 | Sugar et al. |
| 7,773,965 B1 | 8/2010 | Van Brunt et al. |

(Continued)

OTHER PUBLICATIONS

Non-Final Office Action for U.S. Appl. No. 14/824,937, mailed Feb. 7, 2017, 7 pages.

(Continued)

*Primary Examiner* — Christopher T Wyllie
(74) *Attorney, Agent, or Firm* — Withrow & Terranova, P.L.L.C.

(57) ABSTRACT

A switchable RF transmit/receive (TX/RX) multiplexer, which includes a group of RF TX bandpass filters, a group of RF TX switching elements, and a group of RF RX bandpass filters; is disclosed. The group of RF TX bandpass filters includes a first RF TX bandpass filter and a second RF TX bandpass filter, such that each of the first RF TX bandpass filter and the second RF TX bandpass filter is coupled to a first filter connection node. The group of RF TX switching elements includes a first RF TX switching element coupled between the first filter connection node and a first common connection node, which is coupled to a first RF antenna. Each of the group of RF RX bandpass filters is coupled to the first common connection node.

15 Claims, 23 Drawing Sheets

(56) References Cited

U.S. PATENT DOCUMENTS

| | | |
|---|---|---|
| 8,680,947 B1 | 3/2014 | Costa et al. |
| 8,693,599 B2 | 4/2014 | Araki et al. |
| 8,767,859 B2 | 7/2014 | Fukamachi et al. |
| 9,565,114 B1* | 2/2017 | Kabbani ............ H04L 45/7453 |
| 9,843,342 B2* | 12/2017 | Khlat ................ H04B 1/0057 |
| 2002/0016183 A1 | 2/2002 | Lehtinen |
| 2002/0183016 A1 | 12/2002 | Kemmochi et al. |
| 2003/0108006 A1* | 6/2003 | Holcman .......... H04W 36/0058 |
| | | 370/335 |
| 2003/0189974 A1 | 10/2003 | Ferry |
| 2003/0203743 A1* | 10/2003 | Sugar ................ H04B 1/0057 |
| | | 455/103 |
| 2004/0048634 A1 | 3/2004 | Satoh et al. |
| 2004/0052272 A1* | 3/2004 | Frank ................ H04B 1/0057 |
| | | 370/468 |
| 2004/0087298 A1* | 5/2004 | Yamawaki ............. H04B 1/406 |
| | | 455/313 |
| 2004/0121753 A1* | 6/2004 | Sugar ................ H04B 1/0057 |
| | | 455/333 |
| 2005/0037800 A1 | 2/2005 | Shih |
| 2005/0085202 A1* | 4/2005 | Ella ................ H04B 1/0057 |
| | | 455/168.1 |
| 2005/0227631 A1* | 10/2005 | Robinett ................ H04B 1/006 |
| | | 455/168.1 |
| 2005/0245201 A1 | 11/2005 | Ella et al. |
| 2006/0031894 A1* | 2/2006 | Petruzzelli ......... H04N 21/4382 |
| | | 725/100 |
| 2006/0044080 A1* | 3/2006 | Hagiwara ................ H03H 7/42 |
| | | 335/193 |
| 2006/0079275 A1* | 4/2006 | Ella ................ H04B 1/006 |
| | | 455/552.1 |
| 2006/0088122 A1 | 4/2006 | Choi et al. |
| 2006/0094393 A1* | 5/2006 | Okuyama ................ H04B 1/44 |
| | | 455/333 |
| 2006/0103485 A1* | 5/2006 | Okuyama ................ H01P 1/15 |
| | | 333/132 |
| 2006/0128302 A1* | 6/2006 | van Rooyen ........ H04B 1/3805 |
| | | 455/3.06 |
| 2006/0250182 A1 | 11/2006 | Takeda et al. |
| 2007/0075803 A1 | 4/2007 | Kemmochi et al. |
| 2008/0102760 A1 | 5/2008 | McConnell et al. |
| 2008/0212552 A1* | 9/2008 | Fukamachi ............ H04B 1/006 |
| | | 370/343 |
| 2009/0003286 A1* | 1/2009 | Korden .................... H04B 1/48 |
| | | 370/335 |
| 2009/0135781 A1 | 5/2009 | Vaisanen et al. |
| 2009/0167455 A1* | 7/2009 | Liu ............................ H03H 7/09 |
| | | 333/167 |
| 2010/0157860 A1* | 6/2010 | Hagiwara ................ H04B 1/48 |
| | | 370/310 |
| 2010/0321130 A1* | 12/2010 | Kim ........................ H03H 7/48 |
| | | 333/101 |
| 2011/0110452 A1* | 5/2011 | Fukamachi .......... H04B 1/0057 |
| | | 375/267 |
| 2011/0210787 A1* | 9/2011 | Lee ............................ H03F 3/68 |
| | | 330/126 |
| 2011/0234335 A1 | 9/2011 | Khlat |
| 2011/0260806 A1* | 10/2011 | Takeuchi ................ H03H 7/461 |
| | | 333/103 |
| 2011/0294553 A1* | 12/2011 | Patil ...................... H05K 9/0024 |
| | | 455/571 |
| 2012/0243447 A1* | 9/2012 | Weissman ............ H04B 1/0458 |
| | | 370/280 |
| 2013/0162495 A1 | 6/2013 | Kwon et al. |
| 2014/0015731 A1* | 1/2014 | Khlat ........................ H01Q 1/50 |
| | | 343/876 |
| 2014/0035700 A1* | 2/2014 | Zeng ...................... H04N 7/102 |
| | | 333/132 |
| 2014/0065985 A1 | 3/2014 | Weissman et al. |
| 2014/0073268 A1* | 3/2014 | Taniuchi ................... H01P 1/10 |
| | | 333/101 |
| 2014/0198880 A1* | 7/2014 | Borodulin ................ H03F 3/19 |
| | | 375/300 |
| 2014/0308906 A1 | 10/2014 | Saji et al. |
| 2014/0376428 A1 | 12/2014 | Verma et al. |
| 2015/0118978 A1 | 4/2015 | Khlat |
| 2015/0124661 A1* | 5/2015 | He ............................ H04L 5/16 |
| | | 370/278 |
| 2015/0257007 A1* | 9/2015 | Solondz ................ H04L 9/3234 |
| | | 713/154 |
| 2016/0049921 A1* | 2/2016 | Khlat ........................ H04B 7/24 |
| | | 370/294 |
| 2016/0049965 A1* | 2/2016 | Khlat .................... H04B 1/0057 |
| | | 370/297 |
| 2016/0049985 A1* | 2/2016 | Khlat ........................ H04L 5/14 |
| | | 370/278 |
| 2017/0012651 A1* | 1/2017 | Ellä ...................... H04L 5/1461 |
| 2019/0222251 A1* | 7/2019 | Khlat ........................ H04L 5/14 |
| 2023/0246609 A1* | 8/2023 | Scott ...................... H03F 1/0277 |
| | | 330/295 |
| 2023/0370109 A1* | 11/2023 | Khlat ........................ H04B 1/44 |

OTHER PUBLICATIONS

Notice of Allowance for U.S. Appl. No. 14/922,803, mailed Mar. 28, 2017, 7 pages.

Final Office Action for U.S. Appl. No. 14/926,116, mailed Oct. 1, 2018, 12 pages.

Non-Final Office Action for U.S. Appl. No. 14/926,116, mailed Jan. 11, 2018, 19 pages.

Non-Final Office Action for U.S. Appl. No. 14/926,116, mailed Jun. 2, 2017, 11 pages.

Non-Final Office Action for U.S. Appl. No. 16/358,843, mailed Feb. 21, 2020, 16 pages.

Final Office Action for U.S. Appl. No. 16/358,843, mailed Aug. 21, 2020, 13 pages.

Applicant-Initiated Interview Summary for U.S. Appl. No. 16/358,843, mailed Nov. 24, 2020, 3 pages.

Non-Final Office Action for U.S. Appl. No. 16/358,843, mailed Feb. 4, 2021, 13 pages.

Final Office Action for U.S. Appl. No. 16/358,843, mailed Aug. 5, 2021, 14 pages.

Non-Final Office Action for U.S. Appl. No. 16/358,843, mailed Jan. 6, 2022, 15 pages.

Final Office Action for U.S. Appl. No. 16/358,843, mailed Aug. 18, 2022, 13 pages.

Non-Final Office Action for U.S. Appl. No. 16/358,843, mailed Nov. 25, 2022, 13 pages.

Final Office Action for U.S. Appl. No. 16/358,843, mailed Mar. 28, 2023, 14 pages.

Advisory Action for U.S. Appl. No. 16/358,843, mailed Jun. 30, 2023, 4 pages.

\* cited by examiner

SWITCHABLE RF TRANSMIT/RECEIVE MULTIPLEXER

RELATED APPLICATIONS

The present application is a continuation of U.S. patent application Ser. No. 16/358,843, filed Mar. 20, 2019, which is a continuation of U.S. patent application Ser. No. 14/926,116, filed Oct. 29, 2015, now U.S. Pat. No. 10,312,960, entitled "SWITCHABLE RF TRANSMIT/RECEIVE MULTIPLEXER," which claims priority to U.S. provisional patent application No. 62/073,096, filed Oct. 31, 2014, and is a continuation-in-part of U.S. patent application Ser. No. 14/824,937, filed Aug. 12, 2015, now U.S. Pat. No. 9,780,866, entitled "CONFIGURABLE RF TRANSMIT/RECEIVE MULTIPLEXER," which claims priority to U.S. provisional patent application No. 62/036,210, filed Aug. 12, 2014.

All of the applications listed above are hereby incorporated herein by reference in their entireties.

FIELD OF THE DISCLOSURE

Embodiments of the present disclosure relate to radio frequency (RF) communications systems, which may include RF front-end circuitry, RF transceiver circuitry, RF transmit circuitry, RF receive circuitry, RF diplexers, RF duplexers, RF filters, RF antennas, RF switches, RF combiners, RF splitters, the like, or any combination thereof.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, flexible, and efficient as is practical. Thus, there is a need for RF circuitry in a communications device that is low cost, small, simple, flexible, and efficient.

SUMMARY

A switchable RF transmit/receive (TX/RX) multiplexer, which includes a group of RF TX bandpass filters, a group of RF TX switching elements, and a group of RF RX bandpass filters; is disclosed. The group of RF TX bandpass filters includes a first RF TX bandpass filter and a second RF TX bandpass filter, such that each of the first RF TX bandpass filter and the second RF TX bandpass filter is coupled to a first filter connection node. The group of RF TX switching elements includes a first RF TX switching element coupled between the first filter connection node and a first common connection node, which is coupled to a first RF antenna. Each of the group of RF RX bandpass filters is coupled to the first common connection node.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

A switchable RF transmit/receive (TX/RX) multiplexer, which includes a group of RF TX bandpass filters, a group of RF TX switching elements, and a group of RF RX bandpass filters; is disclosed. The group of RF TX bandpass filters includes a first RF TX bandpass filter and a second RF TX bandpass filter, such that each of the first RF TX bandpass filter and the second RF TX bandpass filter is coupled to a first filter connection node. The group of RF TX switching elements includes a first RF TX switching element coupled between the first filter connection node and a first common connection node, which is coupled to a first RF antenna. Each of the group of RF RX bandpass filters is coupled to the first common connection node.

Figure 1:
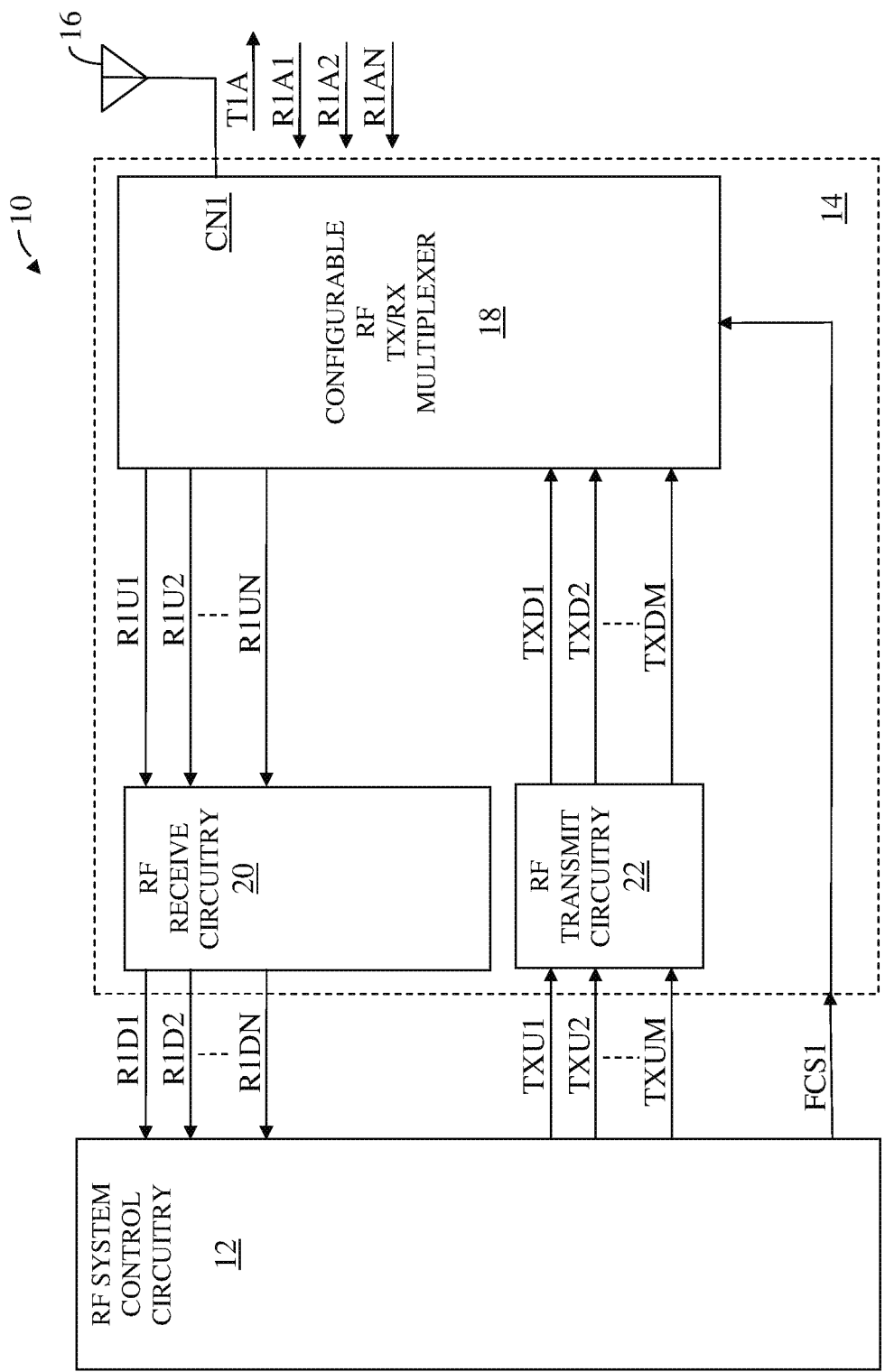
FIG. 1 shows RF communications circuitry according to one embodiment of the RF communications circuitry.

FIG. 1 shows RF communications circuitry 10 according to one embodiment of the RF communications circuitry 10. The RF communications circuitry 10 includes RF system control circuitry 12, RF front-end circuitry 14, and a first RF antenna 16. The RF front-end circuitry 14 includes a configurable RF TX/RX multiplexer 18, RF receive circuitry 20, and RF transmit circuitry 22. The configurable RF TX/RX multiplexer 18 has a first common connection node CN1, which is coupled to the first RF antenna 16. In one embodiment of the configurable RF TX/RX multiplexer 18, the first common connection node CN1 is directly coupled to the first RF antenna 16. The RF system control circuitry 12 provides a first function configuration signal FCS1 to the configurable RF TX/RX multiplexer 18. As such, in one embodiment of the configurable RF TX/RX multiplexer 18, the RF system control circuitry 12 configures the configurable RF TX/RX multiplexer 18 using the first function configuration signal FCS1.

In one embodiment of the RF system control circuitry 12, the RF system control circuitry 12 provides a first upstream RF transmit signal TXU1, a second upstream RF transmit signal TXU2, and up to and including an $M^{TH}$ upstream RF transmit signal TXUM to the RF transmit circuitry 22. In general, the RF system control circuitry 12 provides a group of upstream RF transmit signals TXU1, TXU2, TXUM to the RF transmit circuitry 22.

The RF transmit circuitry 22 processes the first upstream RF transmit signal TXU1 to provide a first downstream RF transmit signal TXD1 to the configurable RF TX/RX multiplexer 18, the second upstream RF transmit signal TXU1 to provide a second downstream RF transmit signal TXD2 to the configurable RF TX/RX multiplexer 18, and up to and including the $M^{TH}$ upstream RF transmit signal TXU1 to provide an $M^{TH}$ downstream RF transmit signal TXDM to the configurable RF TX/RX multiplexer 18. In general, the RF transmit circuitry 22 provides a group of downstream RF transmit signals TXD1, TXD2, TXDM to the configurable RF TX/RX multiplexer 18.

In one embodiment of the RF system control circuitry 12, the RF system control circuitry 12 selects one of the group of downstream RF transmit signals TXD1, TXD2, TXDM using the first function configuration signal FCS1, such that the configurable RF TX/RX multiplexer 18 processes and forwards the selected one of the group of downstream RF transmit signals TXD1, TXD2, TXDM to the first common connection node CN1 to provide a first RF antenna transmit signal T1A, which is transmitted via the first RF antenna 16.

The RF transmit circuitry 22 may include up-conversion circuitry, amplification circuitry, power supply circuitry, filtering circuitry, switching circuitry, combining circuitry, splitting circuitry, dividing circuitry, clocking circuitry, the like, or any combination thereof to process the first upstream RF transmit signal TXU1. In one embodiment of the RF transmit circuitry 22, the RF transmit circuitry 22 includes circuitry to reduce interference of RF receive signals in the configurable RF TX/RX multiplexer 18 by processing the group of downstream RF transmit signals TXD1, TXD2, TXDM in the configurable RF TX/RX multiplexer 18.

In one embodiment of the configurable RF TX/RX multiplexer 18, the configurable RF TX/RX multiplexer 18 receives any or all of a first antenna, first RF receive signal R1A1; a first antenna, second RF receive signal R1A2; and up to and including a first antenna, NIH RF receive signal MAN; which are received via the first RF antenna 16. In general, the configurable RF TX/RX multiplexer 18 receives any or all of a group of first antenna, RF receive signals R1A1 R1A2, R1AN from the first common connection node CN1. In one embodiment of the group of first antenna, RF receive signals R1A1, R1A2, R1AN, any or all of the group of first antenna, RF receive signals R1A1 R1A2, R1AN are received simultaneously, such that the configurable RF TX/RX multiplexer 18 supports receive downlink carrier aggregation (RXDLCA).

The configurable RF TX/RX multiplexer 18 processes and forwards any or all of the group of first antenna, RF receive signals R1A1 R1A2, R1AN from the first common connection node CN1 to provide any or all of a first antenna, first upstream RF receive signal R1U1, a first antenna, second upstream RF receive signal R1U2, and up to and including a first antenna, $N^{TH}$ upstream RF receive signal R1UN. In general, the configurable RF TX/RX multiplexer 18 provides any or all of a group of first antenna, upstream RF receive signals R1U1, R1U2, R1UN to the RF receive circuitry 20.

In one embodiment of the RF receive circuitry 20, the RF receive circuitry 20 receives and processes any or all of the group of the first antenna, upstream RF receive signals R1U1, R1U2, R1UN to provide a corresponding any or all of a group of first antenna, downstream RF receive signals R1D1, R1D2, R1DN.

In an additional embodiment of the RF receive circuitry 20, the RF receive circuitry 20 simultaneously receives and processes any or all of the group of first antenna, upstream RF receive signals R1U1, R1U2, R1UN. As such, the RF receive circuitry 20 supports RXDLCA. The RF receive circuitry 20 may include down-conversion circuitry, amplification circuitry, low noise amplification circuitry, power supply circuitry, filtering circuitry, switching circuitry, combining circuitry, splitting circuitry, dividing circuitry, clocking circuitry, the like, or any combination thereof.

In one embodiment of the RF front-end circuitry 14, any or all of the group of first antenna, RF receive signals R1A1, R1A2, R1AN and the first RF antenna transmit signal T1A, any or all of the group of first antenna, upstream RF receive signals R1U1, R1U2, R1UN, any or all of the group of first antenna, downstream RF receive signals R1D1, R1D2, R1DN, any or all of the group of upstream RF transmit signals TXU1, TXU2, TXUM, and any or all of the group of downstream RF transmit signals TXD1, TXD2, TXDM are omitted.

In one embodiment of the RF system control circuitry 12, the RF system control circuitry 12 provides the first function configuration signal FCS1 to the configurable RF TX/RX multiplexer 18, the RF receive circuitry 20, and the RF transmit circuitry 22, As such, the RF system control circuitry 12 may configure, tune, adjust, enable, disable, vary, or any combination thereof, circuits within the configurable RF TX/RX multiplexer 18, the RF receive circuitry 20, the RF transmit circuitry 22, or any combination thereof, as necessary using the first function configuration signal FCS1.

Figure 2:
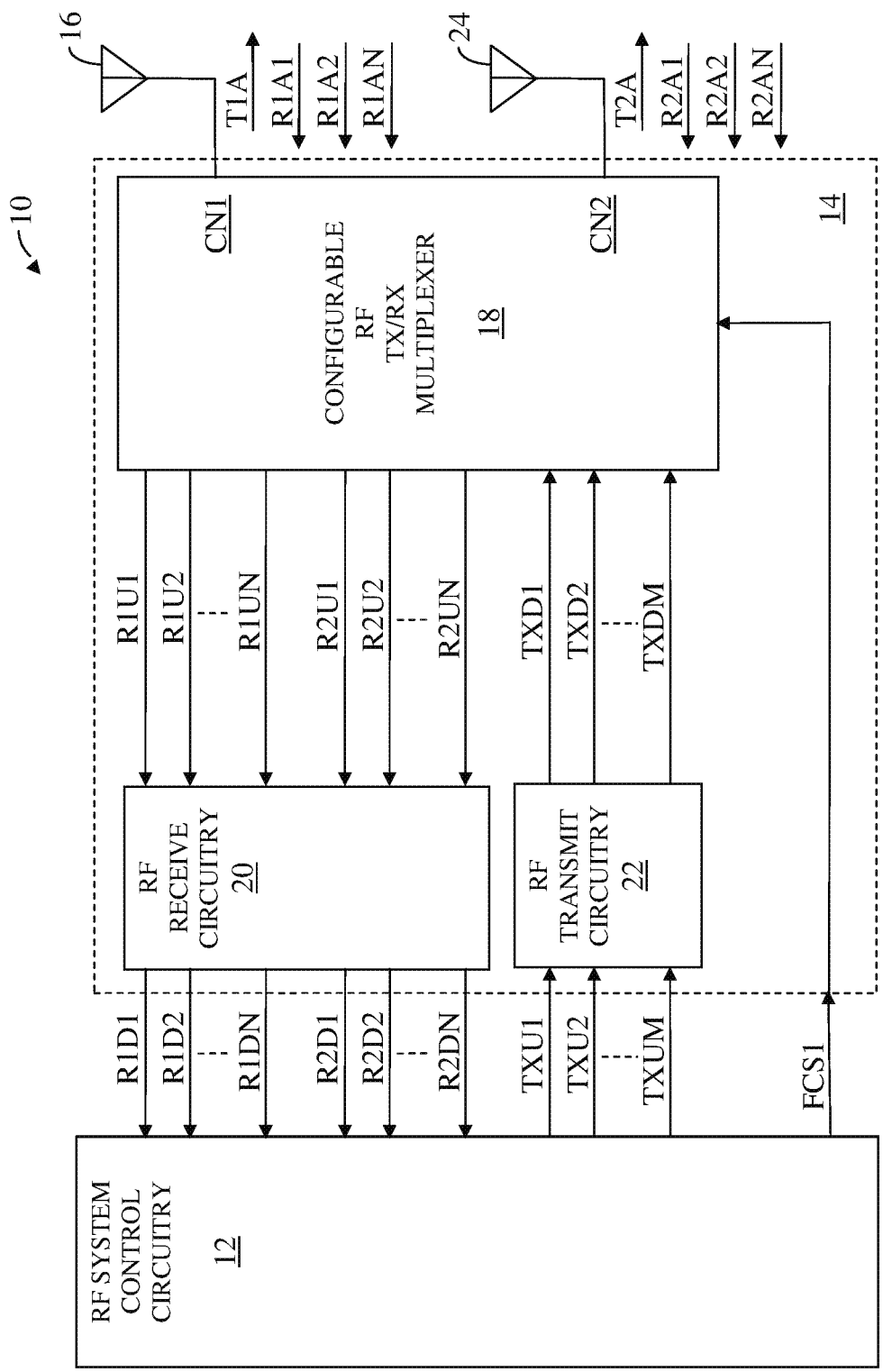
FIG. 2 shows the RF communications circuitry according to an alternate embodiment of the RF communications circuitry.

FIG. 2 shows the RF communications circuitry 10 according to an alternate embodiment of the RF communications circuitry 10. The RF communications circuitry 10 illustrated in FIG. 2 is similar to the RF communications circuitry 10 illustrated in FIG. 1, except the RF communications circuitry 10 illustrated in FIG. 2 further includes a second RE antenna 24. Additionally, the configurable RE TX/RX multiplexer 18 further has a second common connection node CN2, which is coupled to the second RF antenna 24.

In one embodiment of the RF system control circuitry 12, the RF system control circuitry 12 selects one of the group of downstream RF transmit signals TXD1, TXD2, TXDM using the first function configuration signal FCS1, such that the configurable RF TX/RX multiplexer 18 processes and forwards the selected one of the group of downstream RF transmit signals TXD1, TXD2, TXDM to a selected one of the first common connection node CN1 and the second common connection node CN2.

If the selected one of the first common connection node CN1 and the second common connection node CN2 is the first common connection node CN1, then the configurable RF TX/RX multiplexer 18 processes and forwards the selected one of the group of downstream RF transmit signals TXD1, TXD2, TXDM to provide the first RF antenna transmit signal T1A, which is transmitted via the first RF antenna 16. If the selected one of the first common connection node CN1 and the second common connection node CN2 is the second common connection node CN2, then the configurable RF TX/RX multiplexer 18 processes and forwards the selected one of the group of downstream RF transmit signals TXD1, TXD2, TXDM to provide a second RF antenna transmit signal T2A, which is transmitted via the second RF antenna 24.

In one embodiment of the configurable RF TX/RX multiplexer 18, the configurable RF TX/RX multiplexer 18 receives any or all of a second antenna, first RE receive signal R2A1; a second antenna, second RF receive signal R2A2; and up to and including a second antenna, Nm RF receive signal R2AN; which are received via the second RF antenna 24. In general, the configurable RF TX/RX multiplexer 18 receives any or all of a group of first antenna, RF receive signals R1A1 R1A2, R1AN from the first common connection node CN1 and any or all of a group of second antenna, RF receive signals R2A1 R2A2, R2AN from the second common connection node CN2.

In one embodiment of the group of first antenna, RE receive signals R1A1 R1A2, R1AN and the group of second antenna, RF receive signals R2A1, R2A2, R2AN, any or all of the group of first antenna, RF receive signals R1A1, R1A2, R1AN and the group of second antenna, RF receive signals R2A1, R2A2, R2AN are received simultaneously, such that the configurable RF TX/RX multiplexer 18 supports RXDLCA.

The configurable RF TX/RX multiplexer 18 processes and forwards any or all of the group of first antenna, RF receive signals R1A1, R1A2, R1AN from the first common connection node CN1 to provide any or all of the first antenna, first upstream RF receive signal R1U1, the first antenna, second upstream RF receive signal R1U2, and up to and including the first antenna, $N^{TH}$ upstream RF receive signal R1UN.

Further, the configurable RF TX/RX multiplexer 18 processes and forwards any or all of the group of second antenna, RF receive signals R2A1, R2A2, R2AN from the second common connection node CN2 to provide any or all of a second antenna, first upstream RF receive signal R2U1, a second antenna, second upstream RF receive signal R2U2, and up to and including a second antenna, $N^{TH}$ upstream RF receive signal R2UN.

In general, the configurable RF TX/RX multiplexer 18 provides any or all of the group of first antenna, upstream RF receive signals R1U1, R1U2, R1UN and the group of second antenna, upstream RF receive signals R2U1, R2U2, R2UN to the RF receive circuitry 20.

In one embodiment of the RF receive circuitry 20, the RF receive circuitry 20 receives and processes any or all of the first group of the first antenna, upstream RF receive signals R1U1, R1U2, R1UN and the group of the second antenna, upstream RF receive signals R2U1, R2U2, R2UN to provide a corresponding any or all of the group of first antenna, downstream RF receive signals R1D1, R1D2, R1DN and a group of second antenna, downstream RF receive signals R2D1, R2D2, R2DN.

In an additional embodiment of the RF receive circuitry 20, the RF receive circuitry 20 simultaneously receives and processes any or all of the group of first antenna, upstream RF receive signals R1U1, R1U2, R1UN and the group of second antenna, upstream RF receive signals R2U1, R2U2, R2UN. As such, the RF receive circuitry 20 supports RXDLCA.

Figure 3:
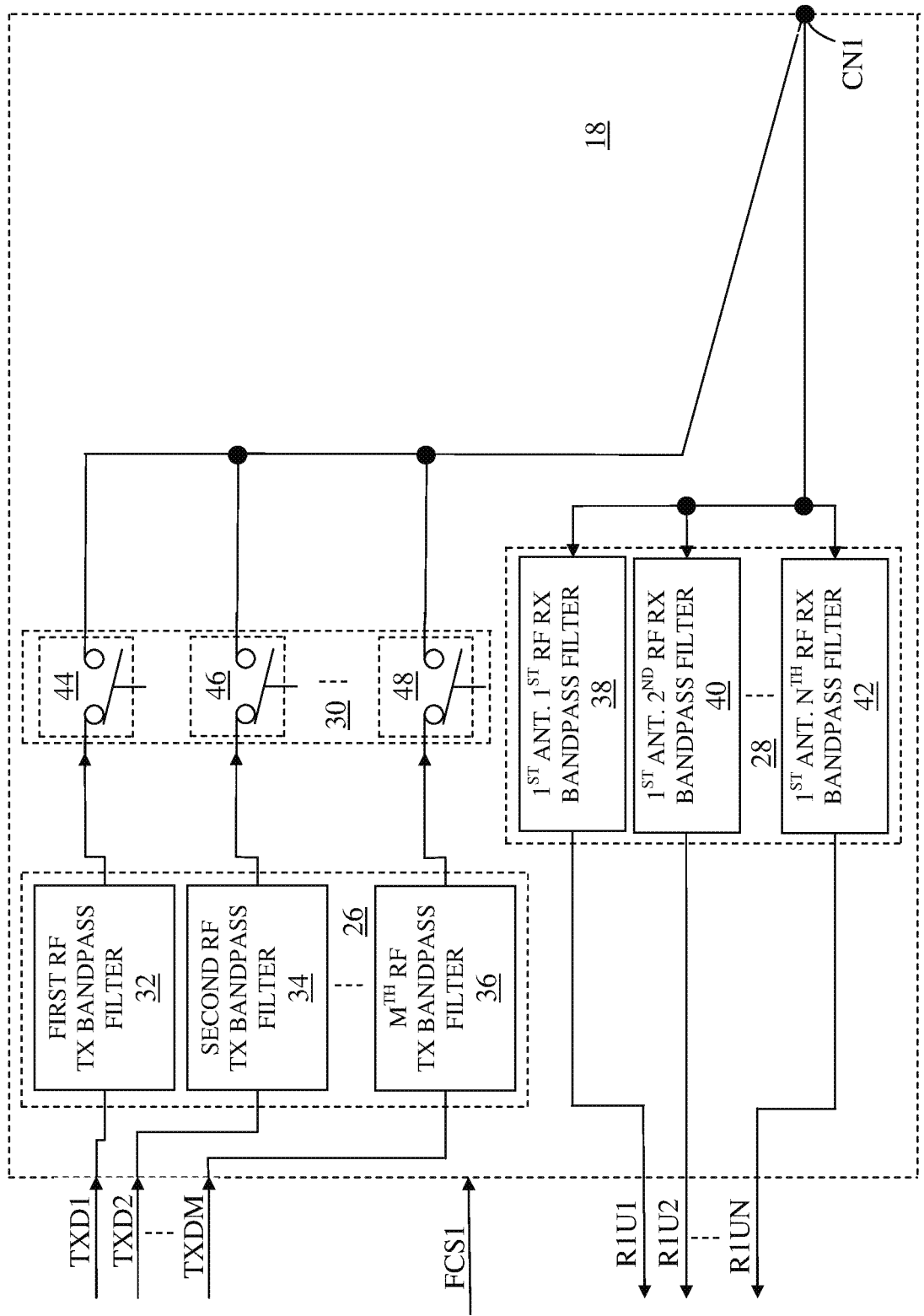
FIG. 3 shows details of a configurable RF TX/RX multiplexer illustrated in FIG. 1 according to one embodiment of the configurable RF TX/RX multiplexer.

FIG. 3 shows details of the configurable RF TX/RX multiplexer 18 illustrated in FIG. 1 according to one embodiment of the configurable RF TX/RX multiplexer 18. The configurable RF TX/RX multiplexer 18 includes a group 26 of RF TX bandpass filters, a first group 28 of RF RX bandpass filters, and a first group 30 of RF TX switching elements, Additionally, the configurable RF TX/RX multiplexer 18 has the first common connection node CN1.

The group 26 of RF TX bandpass filters includes a first RF TX bandpass filter 32, a second RF TX bandpass filter 34, and up to and including an $M^{TH}$ RF TX bandpass filter 36. The first group 28 of RF RX bandpass filters includes a first antenna first RF RX bandpass filter 38, a first antenna second RF RX bandpass filter 40, and up to and including a first antenna $N^{TH}$ RF RX bandpass filter 42. The first group 30 of RF TX switching elements incudes a first antenna first RF TX switching element 44, a first antenna second RF TX switching element 46, and up to and including a first antenna $M^{TH}$ RF TX switching element 48.

In one embodiment of the first group 28 of RF RX bandpass filters, each of the first group 28 of RF RX bandpass filters is coupled to the first common connection node CN1. As such, the first antenna first RF RX bandpass filter 38 is coupled to the first common connection node CN1, the first antenna second RF RX bandpass filter 40 is coupled to the first common connection node CN1, and the first antenna $N^{TH}$ RF RX bandpass filter 42 is coupled to the first common connection node CN1, In an alternate embodiment of the first group 28 of RF RX bandpass filters, any of the first group 28 of RF RX bandpass filters are omitted. In one embodiment of the first group 28 of RF RX bandpass filters, each of the first group 28 of RF RX bandpass filters is directly coupled to the first common connection node CN1.

The first antenna first RF RX bandpass filter 38 receives and filters the first antenna, first RF receive signal R1A1 (FIG. 1) via the first common connection node CN1 to provide the first antenna, first upstream RF receive signal R1U1. The first antenna second RF RX bandpass filter 40 receives and filters the first antenna, second RF receive signal R1A2 (FIG. 1) via the first common connection node CN1 to provide the first antenna, second upstream RF receive signal R1U2. The first antenna $N^{TH}$ RF RX bandpass filter 42 receives and filters the first antenna, $N^{TH}$ RF receive signal R1AN (FIG. 1) via the first common connection node CN1 to provide the first antenna, $N^{TH}$ upstream RF receive signal R1UN. In general, the first group 28 of RF RX bandpass filters provides the group of first antenna, upstream RF receive signals R1U1, R1U2, R1UN.

In general, the first group 30 of RF TX switching elements is coupled between the group 26 of RF TX bandpass filters and the first common connection node CN1, such that each of the first group 30 of RF TX switching elements is coupled between a corresponding one of the group 26 of RF TX bandpass filters and the first common connection node CN1. Specifically, the first antenna first RF TX switching element 44 is coupled between the first RF TX bandpass filter 32 and the first common connection node CN1. The first antenna second RF TX switching element 46 is coupled between the second RF TX bandpass filter 34 and the first common connection node CN1. The first antenna $M^{TH}$ RF TX switching element 48 is coupled between the $M^{TH}$ RF TX bandpass filter 36 and the first common connection node CN1.

When the selected one of the group of downstream RF transmit signals TXD1, TXD2, TXDM to provide the first RF antenna transmit signal T1A (FIG. 1) is the first downstream RF transmit signal TXD1, the first antenna first RF TX switching element 44 is CLOSED and each of a balance of the first group of RF TX switching elements is OPEN. When the selected one of the group of downstream RF transmit signals TXD1, TXD2, TXDM to provide the first RF antenna transmit signal T1A (FIG. 1) is the second downstream RF transmit signal TXD2, the first antenna second RF TX switching element 46 is CLOSED and each of a balance of the first group 30 of RF TX switching elements is OPEN. When the selected one of the group of downstream RF transmit signals TXD1, TXD2, TXDM to provide the first RF antenna transmit signal T1A (FIG. 1) is the $M^{TH}$ downstream RF transmit signal TXDM, the first antenna $M^{TH}$ RF TX switching element 48 is CLOSED and each of a balance of the first group 30 of RF TX switching elements is OPEN.

Figure 4:
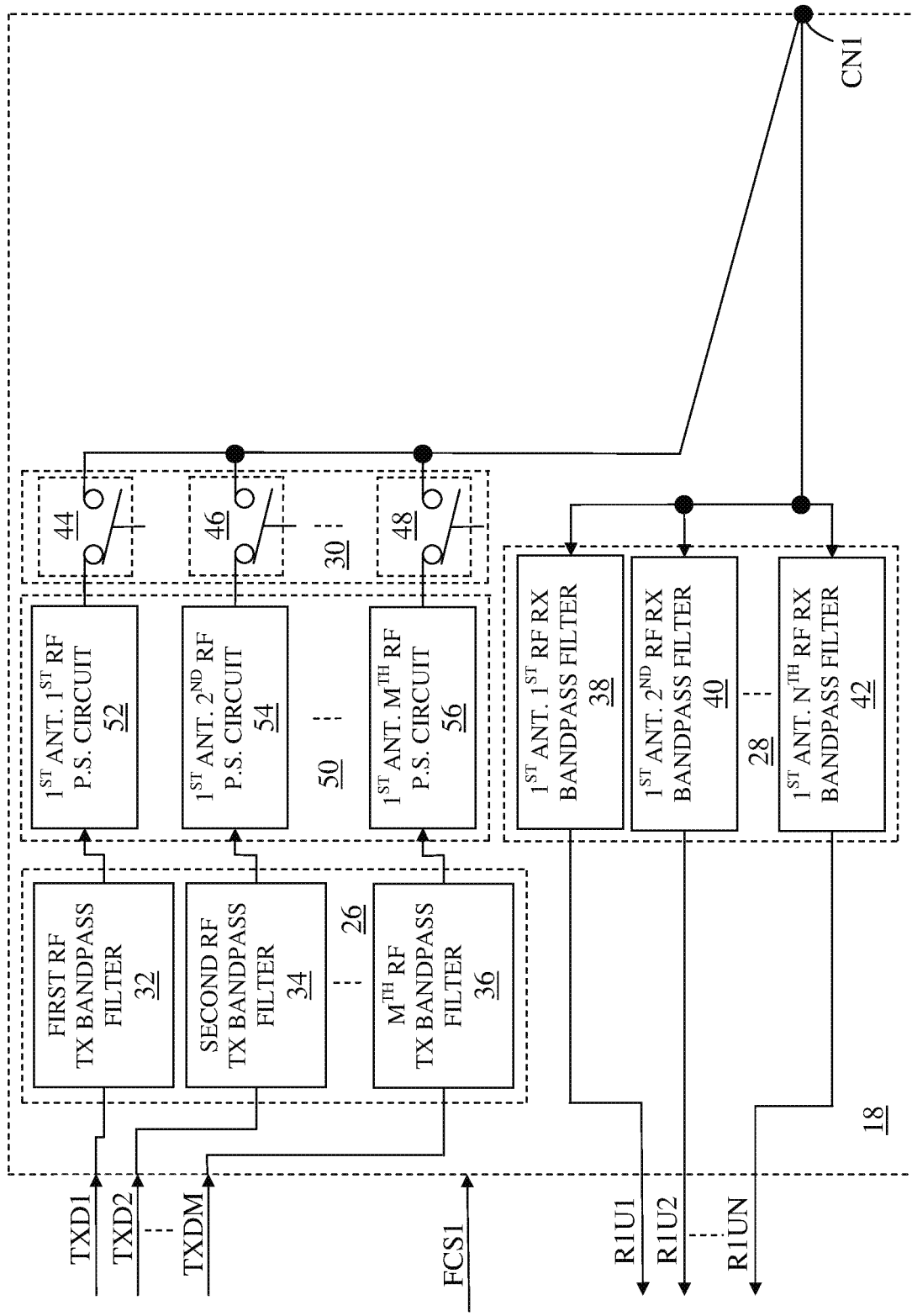
FIG. 4 shows details of the configurable RF TX/RX multiplexer illustrated in FIG. 1 according to an alternate embodiment of the configurable RF TX/RX multiplexer.

FIG. 4 shows details of the configurable RF TX/RX multiplexer 18 illustrated in FIG. 1 according to an alternate embodiment of the configurable RF TX/RX multiplexer 18. The configurable RF TX/RX multiplexer 18 illustrated hi FIG. 4 is similar to the configurable RF TX/RX multiplexer 18 illustrated in FIG. 3, except the configurable RF TX/RX multiplexer 18 illustrated in FIG. 4 further includes a first group 50 of RF phase-shifting circuits. The first group 50 of RF phase-shifting circuits includes a first antenna first RF phase-shifting circuit 52, a first antenna second RF phase-shifting circuit 54, and up to and including a first antenna $M^{TH}$ RF phase-shifting circuit 56.

In general, the first group 50 of RF phase-shifting circuits is coupled between the group 26 of RF TX bandpass filters and the first group 30 of RF TX switching elements, such that each of the first group 50 of RF phase-shifting circuits is coupled between a corresponding one of the group 26 of RF TX bandpass filters and a corresponding one of the first group 30 of RF TX switching elements.

Specifically, the first antenna first RF phase-shifting circuit 52 is coupled between the first RF TX bandpass filter 32 and the first antenna first RF TX switching element 44. The first antenna second RF phase-shifting circuit 54 is coupled between the second RF TX bandpass filter 34 and the first antenna second RF TX switching element 46. The first antenna $M^{TH}$ RF phase-shifting circuit 56 is coupled between the $M^{TH}$ RF TX bandpass filter 36 and the first antenna $M^{TH}$ RF TX switching element 48.

In one embodiment of the first group 50 of RF phase-shifting circuits, each of the first group 50 of RF phase-shifting circuits applies an appropriate phase-shift, such that the group 26 of RF TX bandpass filters and the first group 28 of RF RX bandpass filters support full-duplex operation without significantly interfering with one another. In one embodiment of the first group 50 of RF phase-shifting circuits, each of the first group 50 of RF phase-shifting circuits includes a shunt capacitive element coupled to ground.

Figure 5:
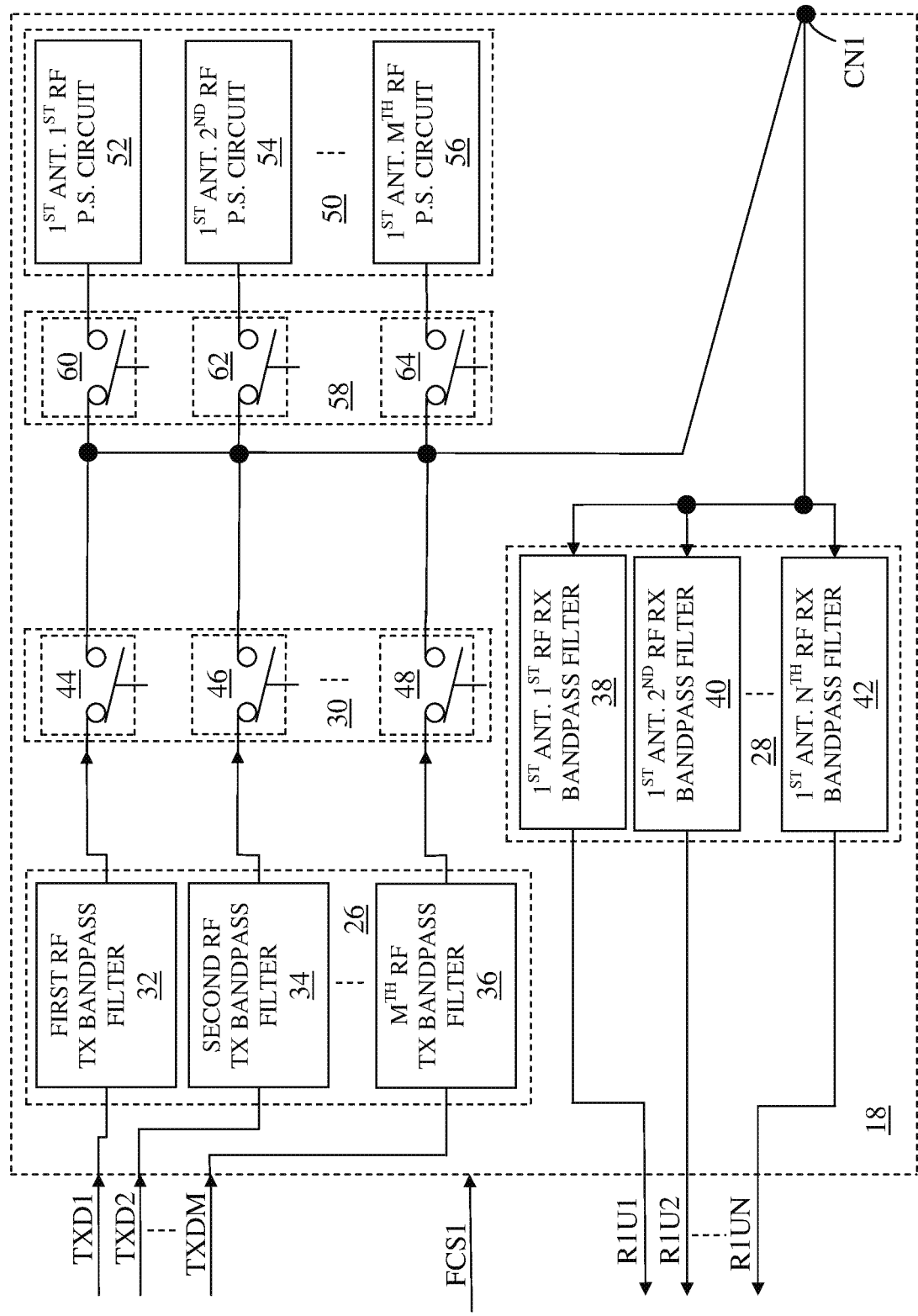
FIG. 5 shows details of the configurable RE TX/RX multiplexer illustrated in FIG. 1 according to an additional embodiment of the configurable RF TX/RX multiplexer.

FIG. 5 shows details of the configurable RF TX/RX multiplexer 18 illustrated in FIG. 1 according to an additional embodiment of the configurable RF TX/RX multiplexer 18. The configurable RF TX/RX multiplexer 18 illustrated in FIG. 5 is similar to the configurable RF TX/RX multiplexer 18 illustrated in FIG. 4, except the configurable RF TX/RX multiplexer 18 illustrated in FIG. 5 further includes a first group 58 of phase-shift switching elements.

The first group 58 of phase-shift switching elements includes a first antenna first phase-shift switching element 60, a first antenna second phase-shift switching element 62, and up to and including a first antenna $M^{TH}$ phase-shift switching element 64. Instead of the first group 50 of RF phase-shifting circuits being coupled between the group 26 of RF TX bandpass filters and the first group 30 of RF TX switching elements, as illustrated in FIG. 4, the first group 58 of phase-shift switching elements is coupled between the first group 50 of RF phase-shifting circuits and the first common connection node CN1. This architecture allows the first group 50 of RF phase-shifting circuits to be used during both receive only conditions and transmit only conditions, as might occur during time-division duplex (TDD) operations.

In general, each of the first group 58 of phase-shift switching elements is coupled between a corresponding one of the first group 50 of RF phase-shifting circuits and the first common connection node CN1, such that during transmission of the first RF antenna transmit signal T1A (FIG. 1) via the first RF antenna 16 (FIG. 1), one of the group 26 of RF TX bandpass filters and a corresponding one of the first group 50 of RF phase-shifting circuits are operationally coupled to the first RF antenna 16 (FIG. 1).

Specifically, the first antenna first phase-shift switching element 60 is coupled between the first antenna first RF phase-shifting circuit 52 and the first common connection node CN1, The first antenna second phase-shift switching element 62 is coupled between the first antenna second RF phase-shifting circuit 54 and the first common connection node CN1. The first antenna $M^{TH}$ phase-shift switching element 64 is coupled between the first antenna $M^{TH}$ RF phase-shifting circuit 56 and the first common connection node CN1. In general, each of the first group 58 of phase-shift switching elements is coupled between a corresponding one of the first group 50 of RF phase-shifting circuits and the first common connection node CN1.

In one embodiment of the configurable RF TX/RX multiplexer 18, during a TDD reception of one of the group of first antenna, RF receive signals R1A1, R1A2, R1AN (FIG. 1) via the first RF antenna 16 (FIG. 1), one of the first group 50 of RF phase-shifting circuits is operationally coupled to the first RF antenna 16 (FIG. 1). In one embodiment of the configurable RF TX/RX multiplexer 18, at least two of the first group 28 of RF RX bandpass filters simultaneously receive and filter a corresponding group of the first antenna, RE receive signals R1A1 R1A2, R1AN (FIG. 1) to provide a corresponding group of first antenna, upstream RF receive signals R1U1, R1U2, R1UN.

Figure 6:
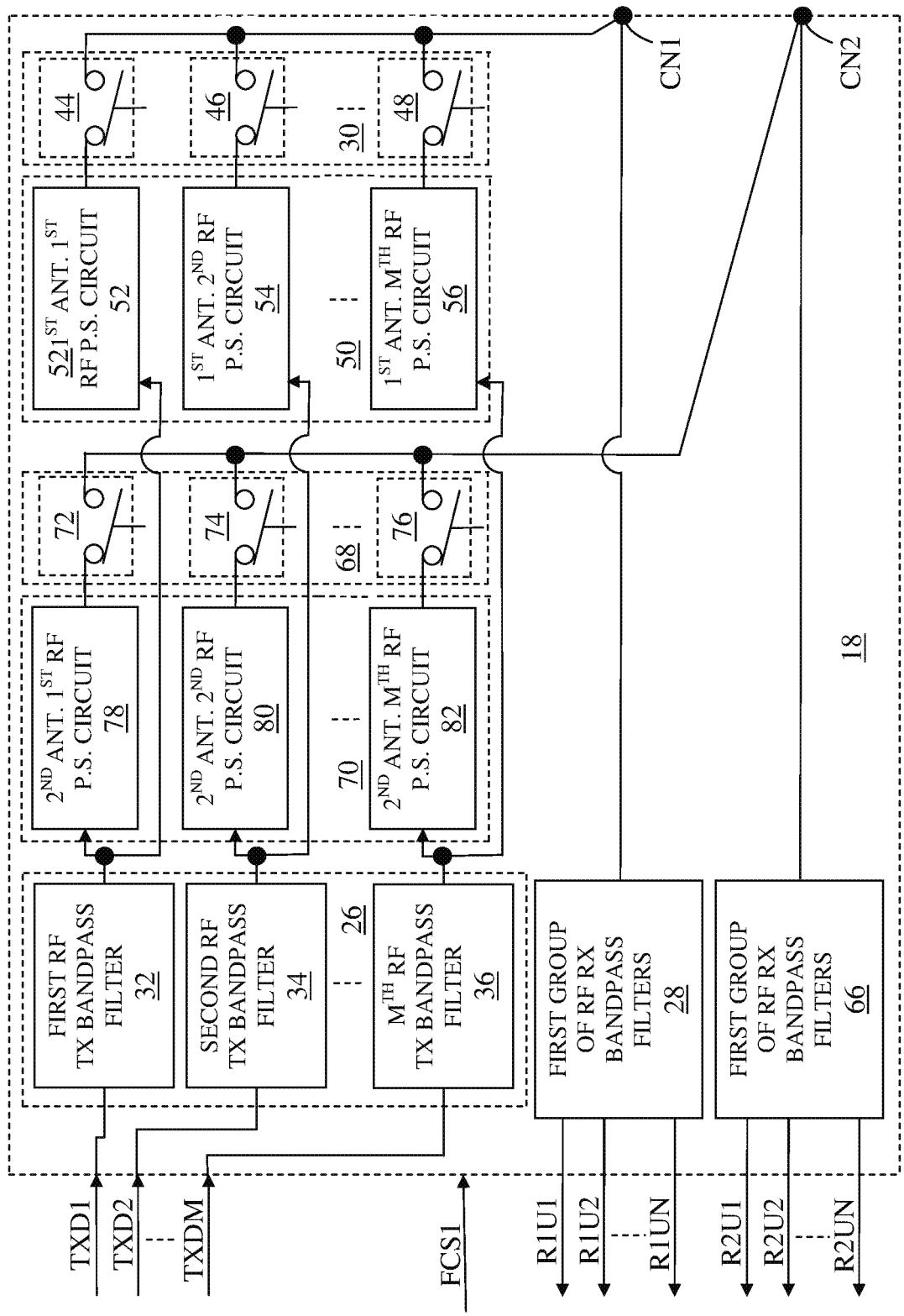
FIG. 6 shows details of the configurable RF TX/RX multiplexer illustrated in FIG. 2 according to one embodiment of the configurable RF TX/RX multiplexer.

FIG. 6 shows details of the configurable RF TX/RX multiplexer 18 illustrated in FIG. 2 according to one embodiment of the configurable RF TX/RX multiplexer 18. The configurable RF TX/RX multiplexer 18 illustrated in FIG. 6 is similar to the configurable RF TX/RX multiplexer 18 illustrated in FIG. 4, except the configurable RF TX/RX multiplexer 18 illustrated in FIG. 6 further includes a second group 66 of RF RX bandpass filters, a second group 68 of RF TX switching elements, and a second group 70 of RF phase-shifting circuits. In addition, the configurable RF TX/RX multiplexer 18 has the second common connection node CN2.

The second group 66 of RF RX bandpass filters is coupled to the second common connection node CN2. Specifically, each of the second group 66 of RF RX bandpass filters is coupled to the second common connection node CN2. The second group 68 of RF TX switching elements is coupled to the second common connection node CN2, The second group 70 of RF phase-shifting circuits is coupled between the group 26 of RF TX bandpass filters and the second group 68 of RF TX switching elements.

The second group 68 of RF TX switching elements includes a second antenna first RF TX switching element 72, a second antenna second RF TX switching element 74, and up to and including a second antenna $M^{TH}$ RF TX switching element 76. The second group 70 of RF phase-shifting circuits includes a second antenna first RE phase-shifting circuit 78, a second antenna second RF phase-shifting circuit 80, and up to and including a second antenna $M^{TH}$ RF phase-shifting circuit 82.

The second antenna first RF phase-shifting circuit 78 is coupled between the first RF TX bandpass filter 32 and the second antenna first RF TX switching element 72. The second antenna second RF phase-shifting circuit 80 is coupled between the second RF TX bandpass filter 34 and the second antenna second RE TX switching element 74. The second antenna $M^{TH}$ RF phase-shifting circuit 82 is coupled between the $M^{TH}$ RF TX bandpass filter 36 and the second antenna $M^{TH}$ RF TX switching element 76.

In general, each of the second group 70 of RF phase-shifting circuits is coupled between a corresponding one of the group 26 of RF TX bandpass filters and a corresponding one of the second group 68 of RF TX switching elements. In an alternate embodiment of the configurable RF TX/RX multiplexer 18, the second group 70 of RF phase-shifting circuits is omitted, such that each of the second group 68 of RF TX switching elements is coupled between a corresponding one of the group 26 of RE TX bandpass filters and the second common connection node CN2.

Figure 7:
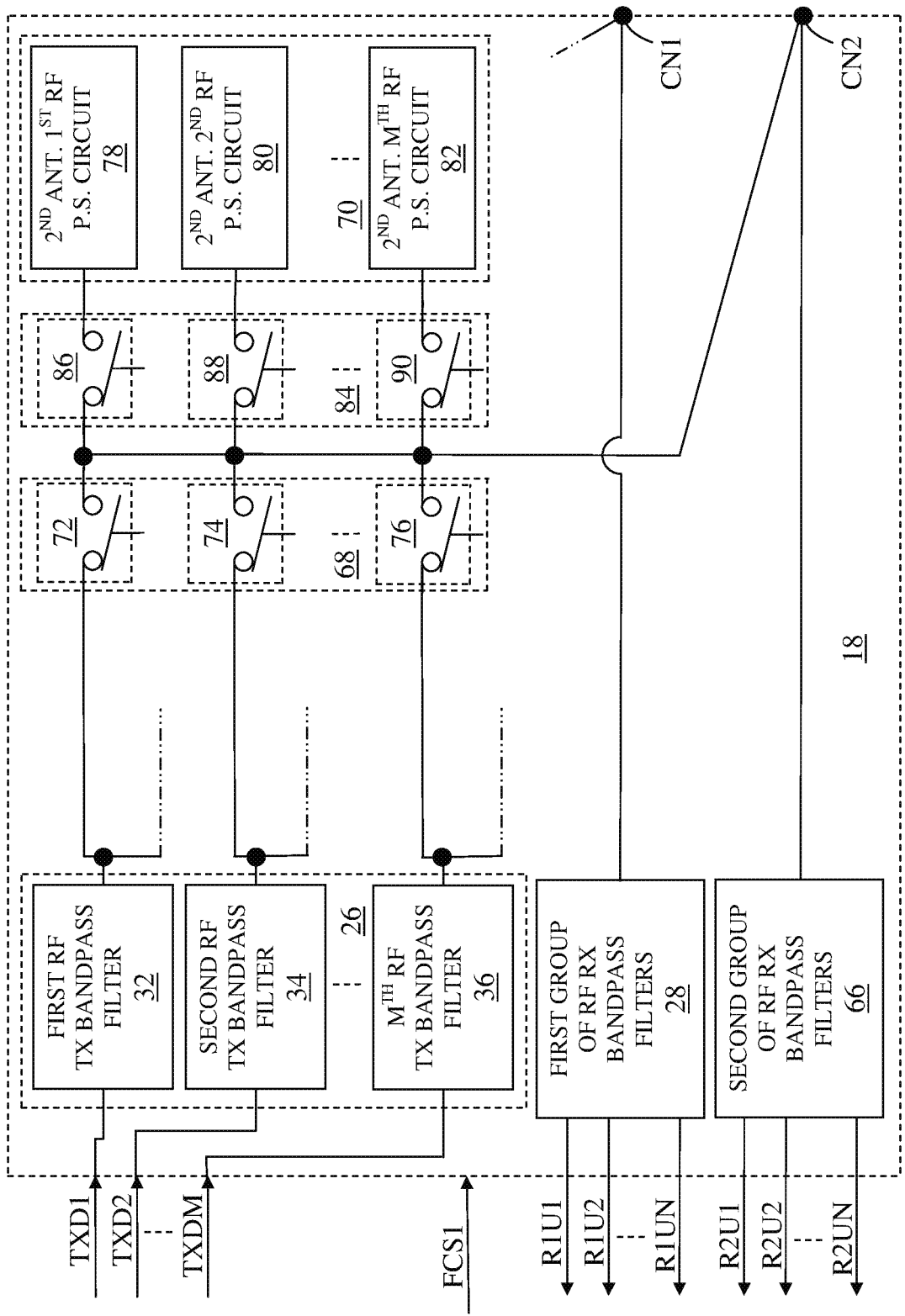
FIG. 7 shows details of the configurable RF TX/RX multiplexer illustrated in FIG. 2 according to an alternate embodiment of the configurable RE TX/RX multiplexer.

FIG. 7 shows details of the configurable RF TX/RX multiplexer 18 illustrated in FIG. 2 according to an alternate embodiment of the configurable RF TX/RX multiplexer 18. The configurable RF TX/RX multiplexer 18 illustrated in FIG. 7 includes the first group 30 of RF TX switching elements, the first group 50 of RF phase-shifting circuits, and the first group 58 of phase-shift switching elements configured as illustrated in FIG. 5. The first group 30 of RE TX switching elements, the first group 50 of RF phase-shifting circuits, and the first group 58 of phase-shift switching elements are not shown in FIG. 7 to simplify FIG. 7. Additionally, the configurable RF TX/RX multiplexer 18 illustrated in FIG. 7 further includes the second group 68 of RE TX switching elements, the second group 70 of RF phase-shifting circuits, and a second group 84 of phase-shift switching elements.

The second group 84 of phase-shift switching elements includes a second antenna first phase-shift switching element 86, a second antenna second phase-shift switching element 88, and up to and including a second antenna Mm phase-shift switching element 90. Each of the second group 68 of RF TX switching elements is coupled between a corresponding one of the group 26 of RF TX bandpass filters and the second common connection node CN2.

Each of the second group 84 of phase-shift switching elements is coupled between a corresponding one of the second group 70 of RF phase-shifting circuits and the second common connection node CN2. Specifically, the second antenna first phase-shift switching element 86 is coupled between the second antenna first RF phase-shifting circuit 78 and the second common connection node CN2. The second antenna second phase-shift switching element 88 is coupled between the second antenna second RF phase-shifting circuit 80 and the second common connection node CN2. The second antenna $M^{TH}$ phase-shift switching element 90 is coupled between the second antenna $M^{TH}$ RF phase-shifting circuit 82 and the second common connection node CN2.

Figure 8:
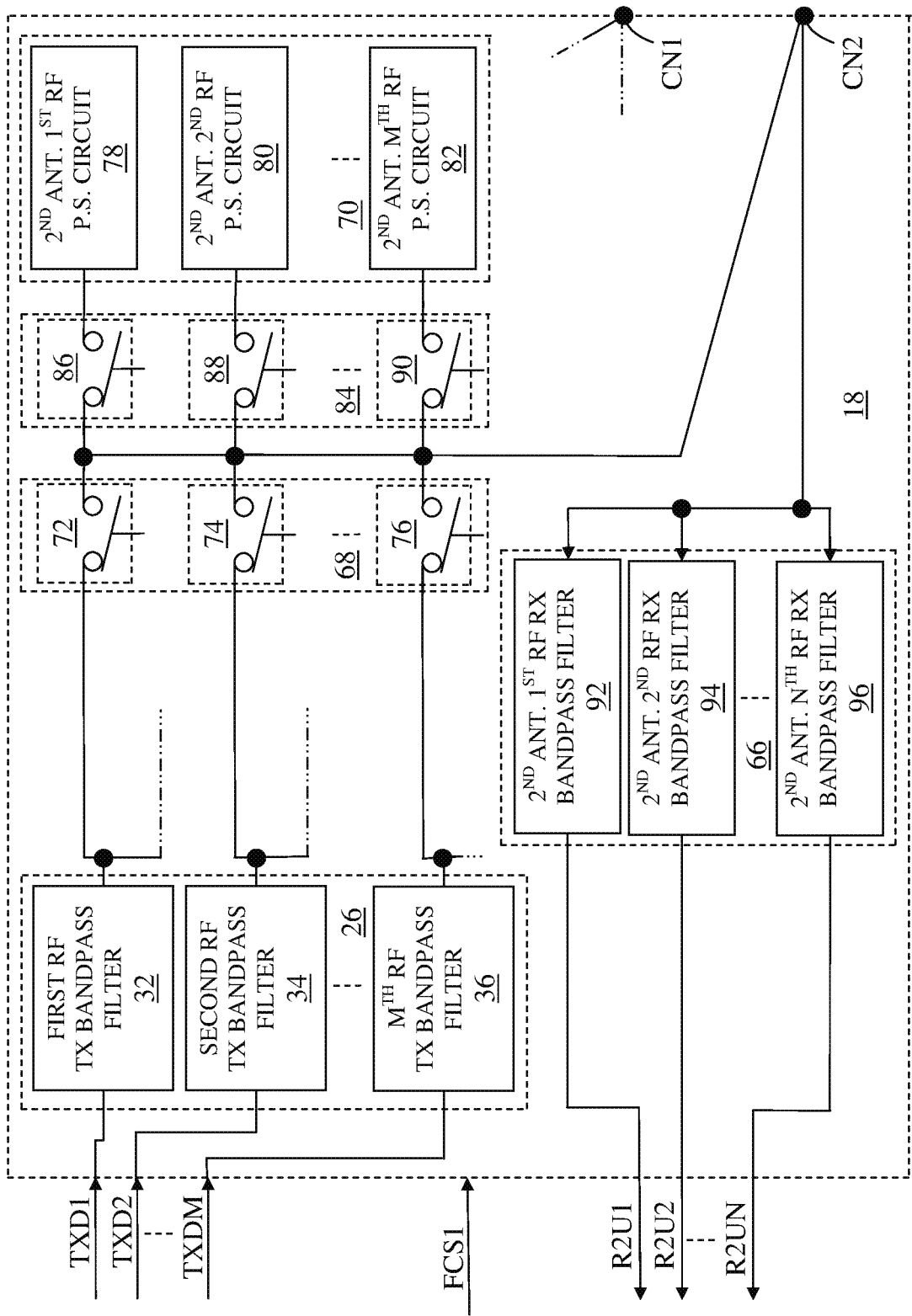
FIG. 8 shows details of the configurable RE TX/RX multiplexer illustrated in FIG. 2 according to an additional embodiment of the configurable RF TX/RX multiplexer.

FIG. 8 shows details of the configurable RF TX/RX multiplexer 18 illustrated in FIG. 2 according to an additional embodiment of the configurable RF TX/RX multiplexer 18. The configurable RF TX/RX multiplexer 18 illustrated in FIG. 8 is similar to the configurable RF TX/RX multiplexer 18 illustrated in FIG. 7, except in the configurable RF TX/RX multiplexer 18 illustrated in FIG. 8, the first group 28 of RF RX bandpass filters is not shown to simplify FIG. 8 and details of the second group 66 of RF RX bandpass filters are shown. The second group 66 of RF RX bandpass filters includes a second antenna first RF RX bandpass filter 92, a second antenna second RF RX bandpass filter 94, and up to and including a second antenna $N^{TH}$ RF RX bandpass filter 96.

In one embodiment of the second group 66 of RF RX bandpass filters, each of the second group 66 of RF RX bandpass filters is coupled to the second common connection node CN2. As such, the second antenna first RF RX bandpass filter 92 is coupled to the second common connection node CN2. The second antenna second RF RX bandpass filter 94 is coupled to the second common connection node CN2. The second antenna $N^{TH}$ RF RX bandpass filter 96 is coupled to the second common connection node CN2.

The second antenna first RF RX bandpass filter 92 receives and filters the second antenna, first RF receive signal R2A1 (FIG. 2) via the second common connection node CN2 to provide the second antenna, first upstream RF receive signal R2U1. The second antenna second RF RX bandpass filter 94 receives and filters the second antenna, second RF receive signal R2A2 (FIG. 2) via the second common connection node CN2 to provide the second antenna, second upstream RF receive signal R2U2. The second antenna $N^{TH}$ RF RX bandpass filter 96 receives and filters the second antenna, $N^{TH}$ RF receive signal R2AN (FIG. 2) via the second common connection node CN2 to provide the second antenna, $N^{TH}$ upstream RF receive signal R2UN. In general, the second group 66 of RF RX bandpass filters provides the first group of second antenna, upstream RF receive signals R2U1, R2U2, R2UN.

In an alternate embodiment of the second group 66 of RF RX bandpass filters, any of the second group 66 of RF RX bandpass filters are omitted. In one embodiment of the second group 66 of RF RX bandpass filters, each of the second group 66 of RF RX bandpass filters is directly coupled to the second common connection node CN2.

Figure 9:
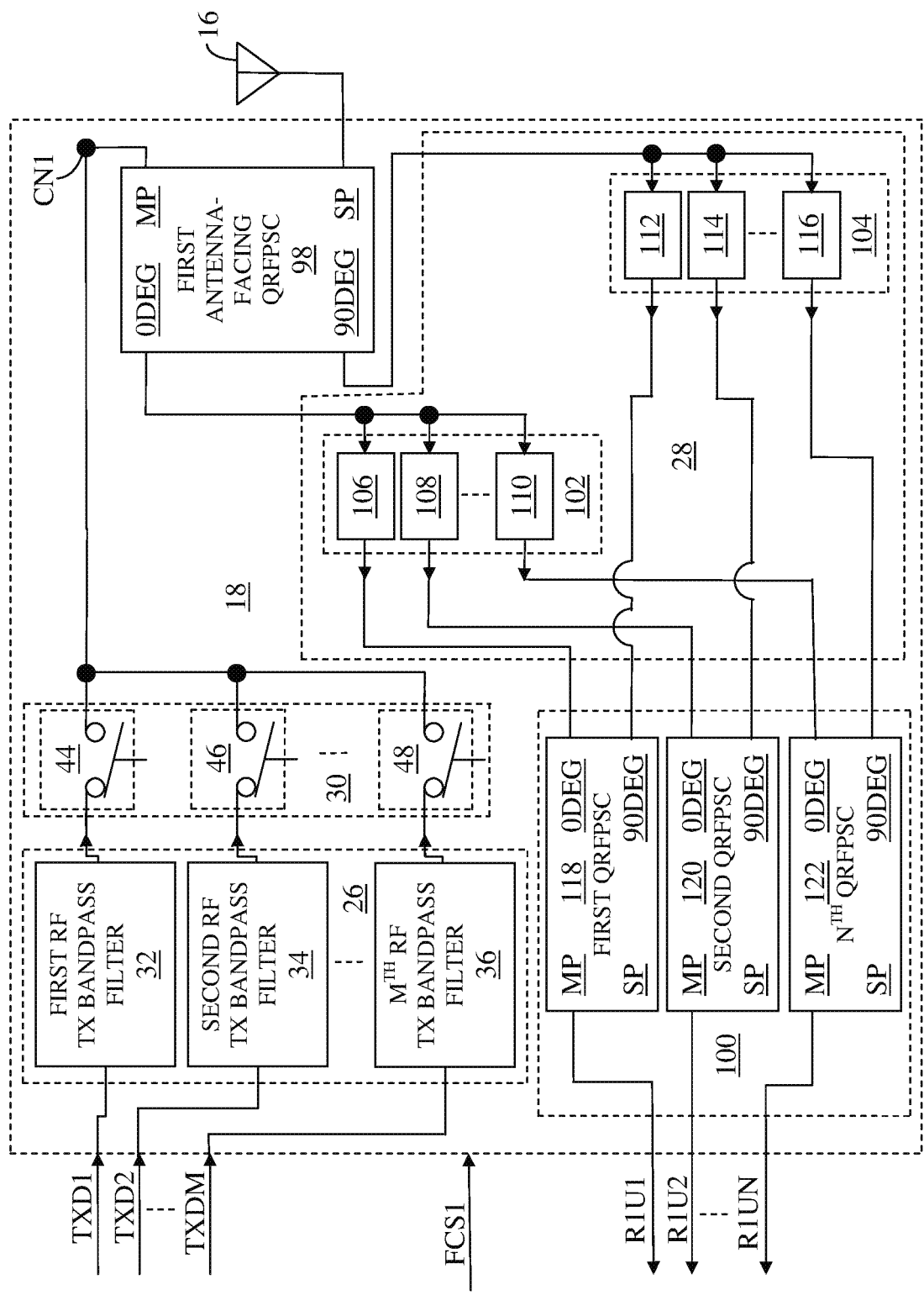
FIG. 9 shows details of the configurable RF TX/RX multiplexer illustrated in FIG. 1 and a first RF antenna according to one embodiment of the configurable RF TX/RX multiplexer and the first RF antenna.

FIG. 9 shows details of the configurable RF TX/RX multiplexer 18 illustrated in FIG. 1 and the first RF antenna 16 according to one embodiment of the configurable RF TX/RX multiplexer 18 and the first RF antenna 16. The configurable RF TX/RX multiplexer 18 includes the group 26 of RF TX bandpass filters, the first group 28 of RF RX bandpass filters, the first group 30 of RF TX switching elements, a first antenna-facing quadrature RF power splitter/combiner (QRFPSC) 98, and a first group 100 of QRFPSCs. Additionally, the configurable RF TX/RX multiplexer 18 has the first common connection node CN1. The group 26 of RF TX bandpass filters and the first group 30 of RF TX switching elements illustrated in FIG. 9 are similar to the group 26 of RF TX bandpass filters and the first group 30 of RF TX switching elements illustrated in FIG. 3. The first group 28 of RF RX bandpass filters includes a first group 102 of in-phase RF RX bandpass filters and a first group 104 of quadrature-phase RF RX bandpass filters.

The first group 102 of in-phase RF RX bandpass filters includes a first in-phase RF RX bandpass filter 106, a second in-phase RF RX bandpass filter 108, and up to and including an $N^{TH}$ in-phase RF RX bandpass filter 110. The first group 104 of quadrature-phase RF RX bandpass filters includes a first quadrature-phase RF RX bandpass filter 112, a second quadrature-phase RF RX bandpass filter 114, and up to and including an $N^{TH}$ quadrature-phase RF RX bandpass filter 116. The first group 100 of QRFPSCs includes a first QRFPSC 118, a second QRFPSC 120, and up to and including an $N^{TH}$ QRFPSC 122.

Each of the first antenna-facing QRFPSC 98 and the first group 100 of QRFPSCs includes a corresponding isolation port SP, main port MP, and pair of quadrature ports 0DEG, 90DEG. The pair of quadrature ports 0DEG, 90DEG includes an in-phase port 0DEG and a quadrature-phase port 90DEG. The first antenna-facing QRFPSC 98 is coupled between the first RF antenna 16 and the first common connection node CN1. The first antenna-facing QRFPSC 98 is further coupled between the first group 28 of RF RX bandpass filters and the first RF antenna 16. The first group 100 of QRFPSCs is coupled to the first group 28 of RF RX bandpass filters.

In one embodiment of the first antenna-facing QRFPSC 98 and the first group 100 of QRFPSCs, each of the first antenna-facing QRFPSC 98 and the first group 100 of QRFPSCs are hybrid RF couplers. In one embodiment of the first antenna-facing QRFPSC 98, the first antenna-facing QRFPSC 98 includes a corresponding group of acoustic-based RF resonators (ABRFR) s. In one embodiment of the first group 100 of QRFPSCs, each of the first group 100 of QRFPSCs includes a corresponding group of ABRFRs. In one embodiment of the first group 28 of RF RX bandpass filters, the first group 28 of RF RX bandpass filters includes a corresponding group of ABRFRs. In one embodiment of the second group 66 (FIG. 8) of RF receive bandpass filters, the second group 66 of RF RX bandpass filters (FIG. 8) includes a corresponding group of ABRFRs.

In one embodiment of the configurable RF TX/RX multiplexer 18, the first in-phase RF RX bandpass filter 106 is coupled between an in-phase port 0DEG of the first QRFPSC 118 and an in-phase port 0DEG of the first antenna-facing QRFPSC 98. The second in-phase RF RX bandpass filter 108 is coupled between an in-phase port 0DEG of the second QRFPSC 120 and the in-phase port 0DEG of the first antenna-facing QRFPSC 98. The $N^{TH}$ in-phase RF RX bandpass filter 110 is coupled between an in-phase port 0DEG of the $N^{TH}$ QRFPSC 122 and the in-phase port 0DEG of the first antenna-facing QRFPSC 98.

In one embodiment of the configurable RF TX/RX multiplexer 18, the first quadrature-phase RF RX bandpass filter 112 is coupled between a quadrature-phase port 90DEG of the first QRFPSC 118 and a quadrature-phase port 90DEG of the first antenna-facing QRFPSC 98. The second quadrature-phase RF RX bandpass filter 114 is coupled between a quadrature-phase port 90DEG of the second QRFPSC 120 and the quadrature-phase port 90DEG of the first antenna-facing QRFPSC 98. The $N^{TH}$ quadrature-phase RF RX bandpass filter 116 is coupled between a quadrature-phase port 90DEG of the $N^{TH}$ QRFPSC 122 and the quadrature-phase port 90DEG of the first antenna-facing QRFPSC 98.

In one embodiment of the first group 100 of QRFPSCs, the first QRFPSC 118 provides the first antenna, first upstream RF receive signal R1U1 via a main port MP of the first QRFPSC 118. The second QRFPSC 120 provides the first antenna, second upstream RF receive signal R1U2 via a main port MP of the second QRFPSC 120. The $N^{TH}$ QRFPSC 122 provides the first antenna, $N^{TH}$ upstream RF receive signal R1UN via a main port MP of the $N^{TH}$ QRFPSC 122.

In one embodiment of the first group 100 of QRFPSCs each of the first group 100 of QRFPSCs has a corresponding isolation port SP. As such, each corresponding isolation port SP of any or all of the first group 100 of QRFPSCs may be coupled to any or all of a corresponding group of resistive elements (not shown). Each of the corresponding group of resistive elements (not shown) may be coupled between a corresponding isolation port SP and ground.

Figure 10:
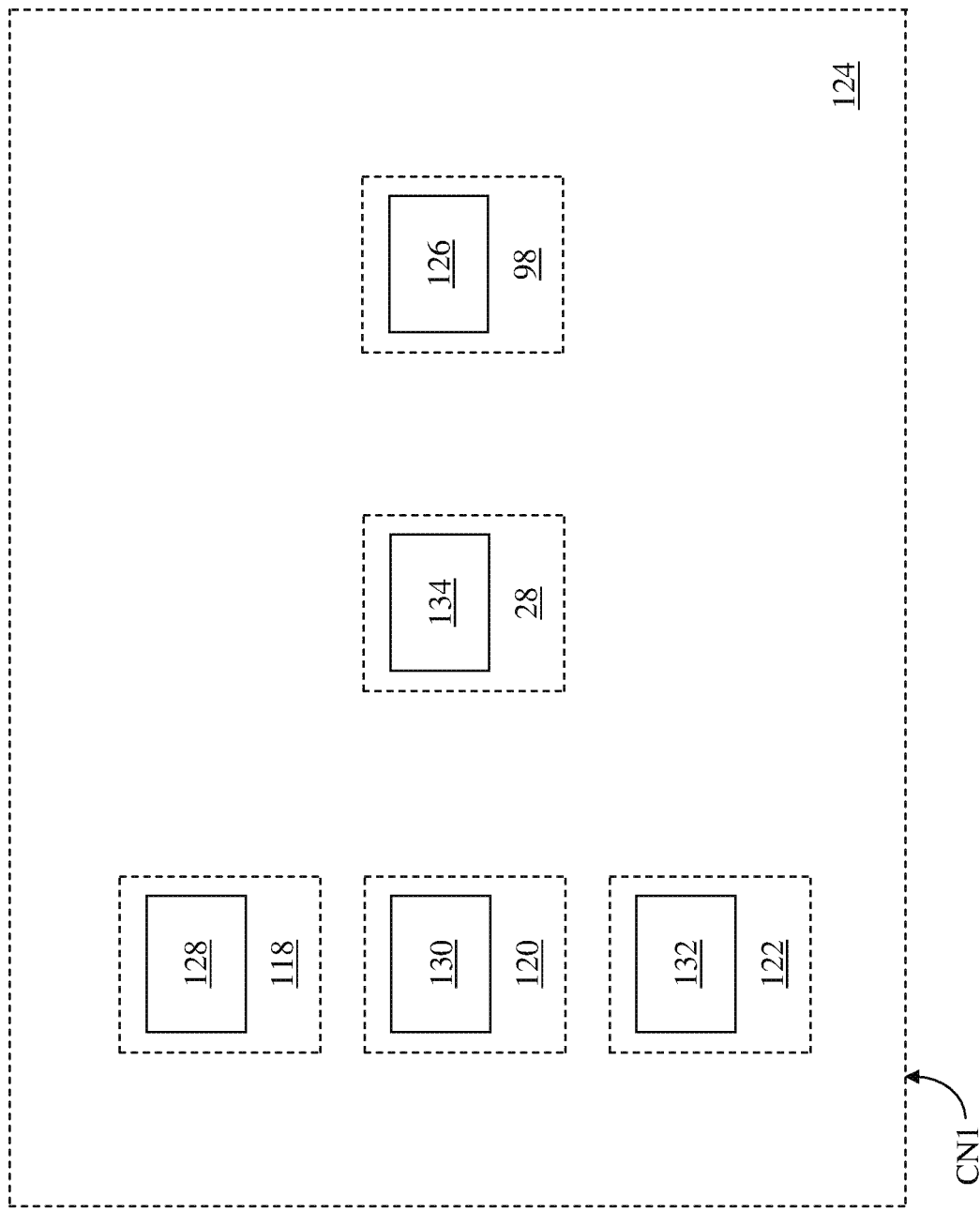
FIG. 10 shows details of the configurable RF TX/RX multiplexer illustrated in FIG. 9 according to one embodiment of the configurable RF TX/RX multiplexer.

FIG. 10 shows details of the configurable RF TX/RX multiplexer 18 illustrated in FIG. 9 according to one embodiment of the configurable RF TX/RX multiplexer 18. The configurable RF TX/RX multiplexer 18 illustrated in FIG. 10 includes an acoustic substrate 124. The acoustic substrate 124 includes the first group 28 of RF RX bandpass filters, the first antenna-facing QRFPSC 98, the first QRFPSC 118, the second QRFPSC 120, and the $N^{TH}$ QRFPSC 122.

The first antenna-facing QRFPSC 98 includes a first group of ABRFRs 126. The first QRFPSC 118 includes a second group of ABRFRs 128. The second QRFPSC 120 includes a third group of ABRFRs 130. The NIH QRFPSC 122 includes a fourth group of ABRFRs 132. The first group 28 of RE RX bandpass filters includes the fifth group of ABRFRs 134. In one embodiment of the first group of ABRFRs 126, the second group of ABRFRs 128, the third group of ABRFRs 130, the fourth group of ABRFRs 132, and the fifth group of ABRFRs 134, each of the first group of ABRFRs 126, the second group of ABRFRs 128, the third group of ABRFRs 130, the fourth group of ABRFRs 132, and the fifth group of ABRFRs 134 includes surface acoustic wave (SAW) RF circuitry.

In one embodiment of the first group of ABRFRs 126, the second group of ABRFRs 128, the third group of ABRFRs 130, the fourth group of ABRFRs 132, and the fifth group of ABRFRs 134, each of the first group of ABRFRs 126, the second group of ABRFRs 128, the third group of ABRFRs 130, the fourth group of ABRFRs 132, and the fifth group of ABRFRs 134 includes bulk acoustic wave (BAW) RF circuitry.

Figure 11A:
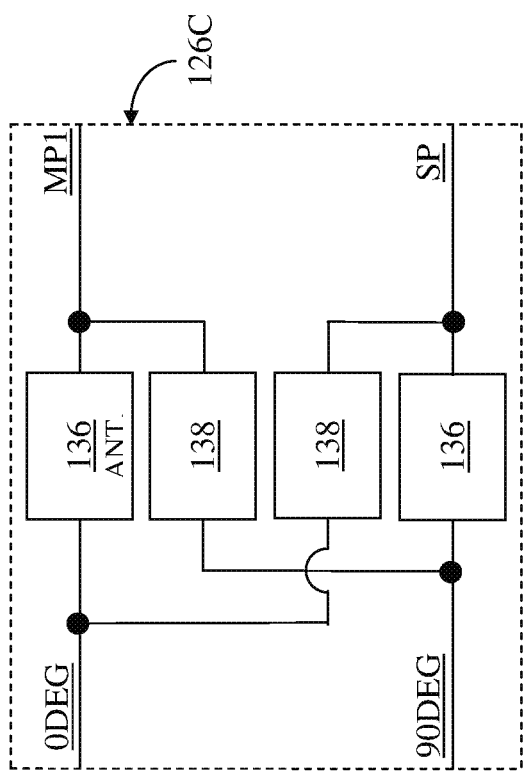
FIG. 11A shows details of a first group of acoustic-based RE resonators (ABRFR)s illustrated in FIG. 10 according to one embodiment of the first group of ABRFRs.

FIG. 11A shows details of the first group of ABRFRs 126 illustrated in FIG. 10 according to one embodiment of the first group of ABRFRs 126. The first group of ABRFRs 126 includes a pair of in-line coupled ABRFRs 136 and a pair of cross-coupled ABRFRs 138. One in-line coupled ABRFR 136 is coupled between the main port MP and the in-phase port 0DEG. Another in-line coupled ABRFR 136 is coupled between the isolation port SP and the quadrature-phase port 90DEG. One cross-coupled ABRFR 138 is coupled between the main port MP and the quadrature-phase port 90DEG. Another cross-coupled ABRFR 138 is coupled between the isolation port SP and the in-phase port 0DEG.

Figure 11B:
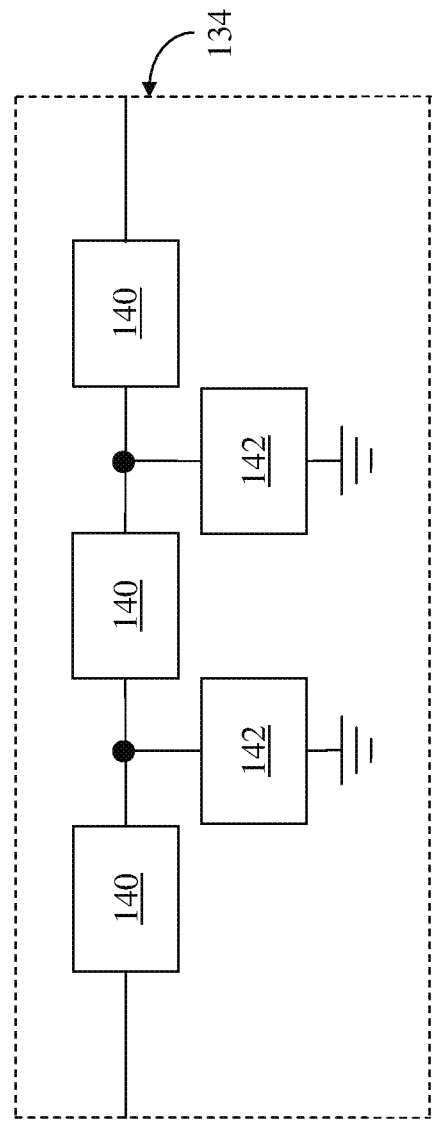
FIG. 11B shows details of a fifth group of ABRFRs illustrated in FIG. 10 according to one embodiment of the fifth group of ABRFRs.

FIG. 11B shows details of the fifth group of ABRFRs 134 illustrated hi FIG. 10 according to one embodiment of the fifth group of ABRFRs 134. The fifth group of ABRFRs 134 includes multiple series-coupled ABRFRs 140 and multiple shunt-coupled ABRFRs 142. In general, two or more series-coupled ABRFRs 140 are coupled in series with one another. The series-coupled ABRFR 140s may be used to form multiple series couplings. In general, a shunt-coupled ABRFR 142 may be coupled between ground and a coupling between two series-coupled ABRFRs 140.

Figure 12:
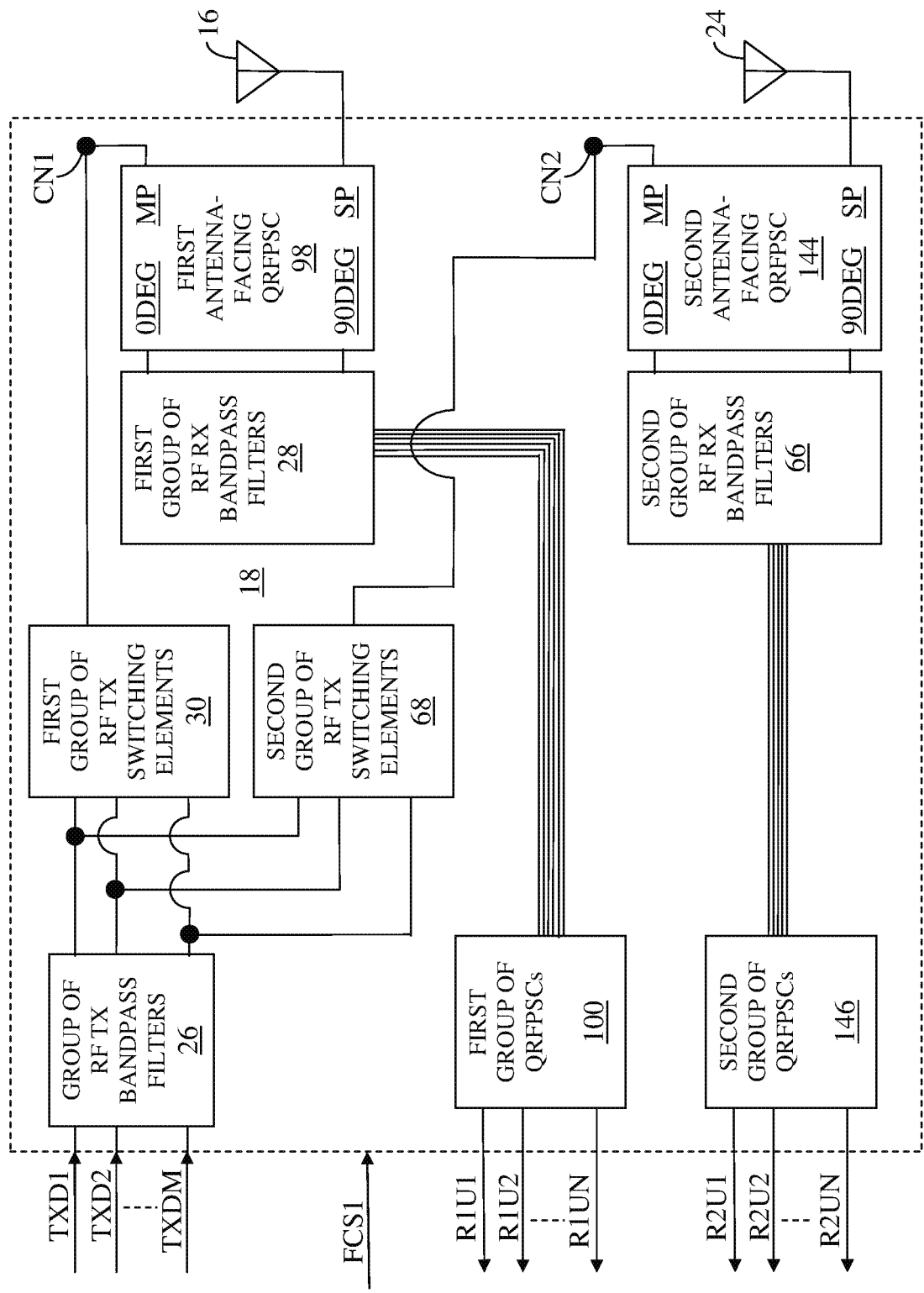
FIG. 12 shows details of the configurable RF TX/RX multiplexer illustrated in FIG. 2 according to one embodiment of the configurable RF TX/RX multiplexer.

FIG. 12 shows details of the configurable RF TX/RX multiplexer 18 illustrated in FIG. 2 according to one embodiment of the configurable RF TX/RX multiplexer 18. The configurable RF TX/RX multiplexer 18 illustrated in FIG. 12 is similar to the configurable RF TX/RX multiplexer 18 illustrated in FIG. 9, except the second RF antenna 24 is shown in FIG. 12 and the configurable RF TX/RX multiplexer 18 further includes the second group 66 of RF RX bandpass filters, the second group 68 of RF TX switching elements, a second antenna-facing QRFPSC 144, a second group 146 of QRFPSCs and the second common connection node CN2.

The second group 68 of RE TX switching elements is coupled between the group 26 of RF TX bandpass filters and the second common connection node CN2. As such, each of the second group 68 of RF TX switching elements is coupled between a corresponding one of the group 26 of RF TX bandpass filters and the second common connection node CN2. The second antenna-facing QRFPSC 144 is coupled between the second RF antenna 24 and the second common connection node CN2. In this regard, a main port MP of the second antenna-facing QRFPSC 144 is coupled to the second common connection node CN2 and an isolation port SP of the second antenna-facing QRFPSC 144 is coupled to the second RF antenna 24.

Additionally, the second antenna-facing QRFPSC 144 is coupled between the second group 66 of RF RX bandpass filters and the second RF antenna 24. Specifically, the second group 66 of RF RX bandpass filters is coupled to an in-phase port 0DEG and a quadrature-phase port 90DEG of the second antenna-facing QRFPSC 144. The second group 66 of RF RX bandpass filters is coupled to the second group 146 of QRFPSCs, which provides the second antenna, first upstream RF receive signal R2U1, the second antenna, second upstream RF receive signal R2U2, and up to and including the second antenna, $N^{TH}$ upstream RF receive signal R2UN.

Figure 13:
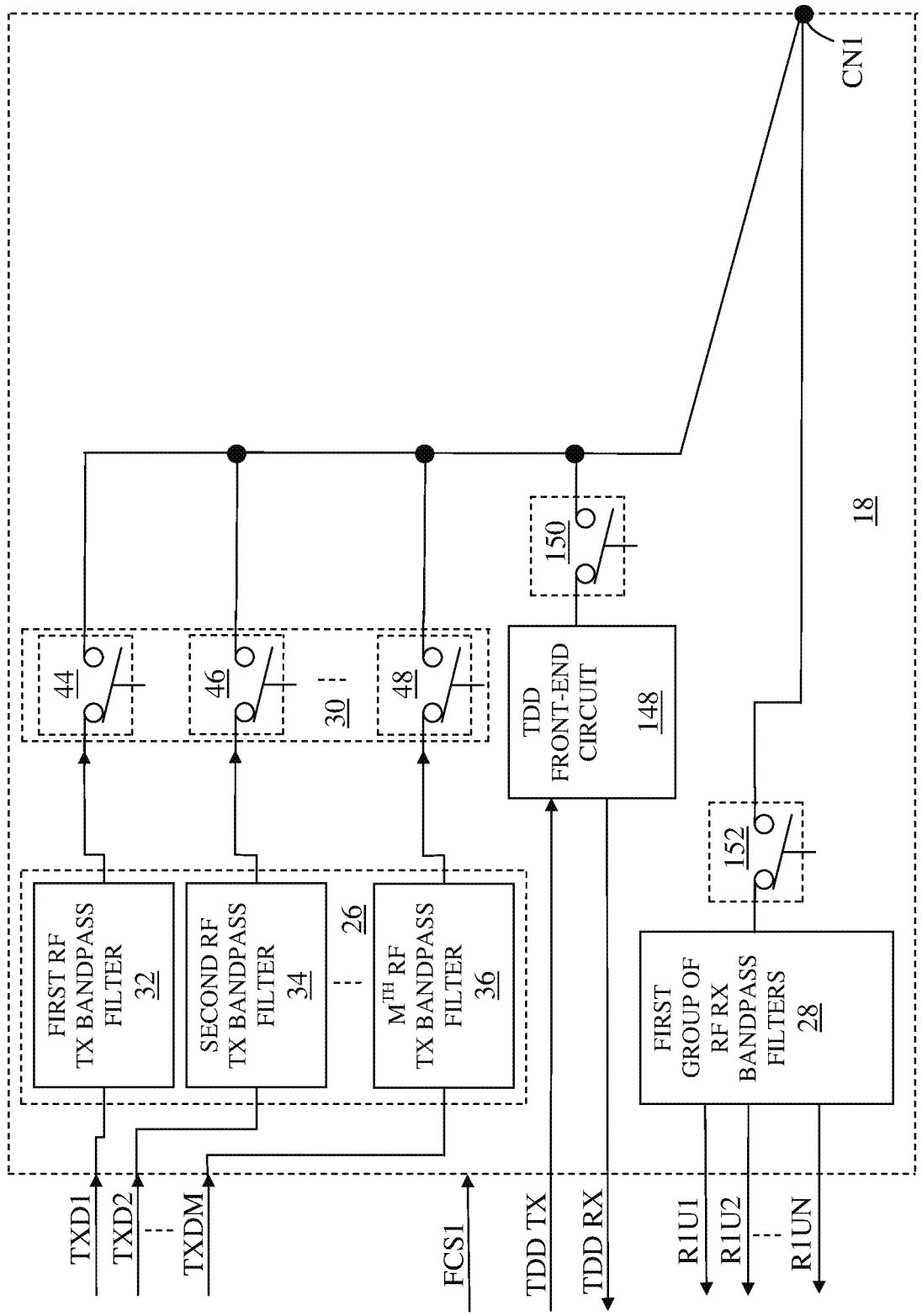
FIG. 13 shows details of the configurable RF TX/RX multiplexer illustrated in FIG. 1 according to one embodiment of the configurable RF TX/RX multiplexer.

FIG. 13 shows details of the configurable RF TX/RX multiplexer 18 illustrated in FIG. 1 according to one embodiment of the configurable RF TX/RX multiplexer 18. The configurable RF TX/RX multiplexer 18 illustrated in FIG. 13 is similar to the configurable RF TX/RX multiplexer 18 illustrated in FIG. 3, except the configurable RF TX/RX multiplexer 18 illustrated in FIG. 13 further includes a TDD front-end circuit 148, a TDD RF switching element 150, and a TDD RF RX switching element 152.

The TDD RF RX switching element 152 is coupled between the first common connection node CN1 and each of the first group 28 of RF RX bandpass filters. The TDD RF switching element 150 is coupled between the first common connection node CN1 and the TDD front-end circuit 148. The configurable RF TX/RX multiplexer 18 operates in one of a normal operating mode, a TDD receive mode, and a TDD transmit mode. During the normal operating mode, the TDD RF switching element 150 is OPEN and the TDD RF RX switching element 152 is CLOSED. As such, the TDD front-end circuit 148 does not significantly load the first common connection node CN1.

During the TDD receive mode, the TDD RF switching element 150 is CLOSED and the TOD RF RX switching element 152 is OPEN. By opening the TDD RF RX switching element 152, the first group 28 of RF RX bandpass filters is substantially isolated from the first common connection node CN1, thereby reducing insertion loss. Additionally, during the TDD receive mode, the TDD front-end circuit 148 provides a TDD RX signal TDD RX.

During the TDD transmit mode, the TDD RF switching element 150 is CLOSED and the TDD RF RX switching element 152 is OPEN. By opening the TDD RF RX switching element 152, the first group 28 of RF RX bandpass filters is substantially isolated from the first common connection node CN1, thereby reducing insertion loss. Additionally, during the TDD transmit mode, the TDD front-end circuit 148 receives and forwards a TDD TX signal TOD TX.

Figure 14:
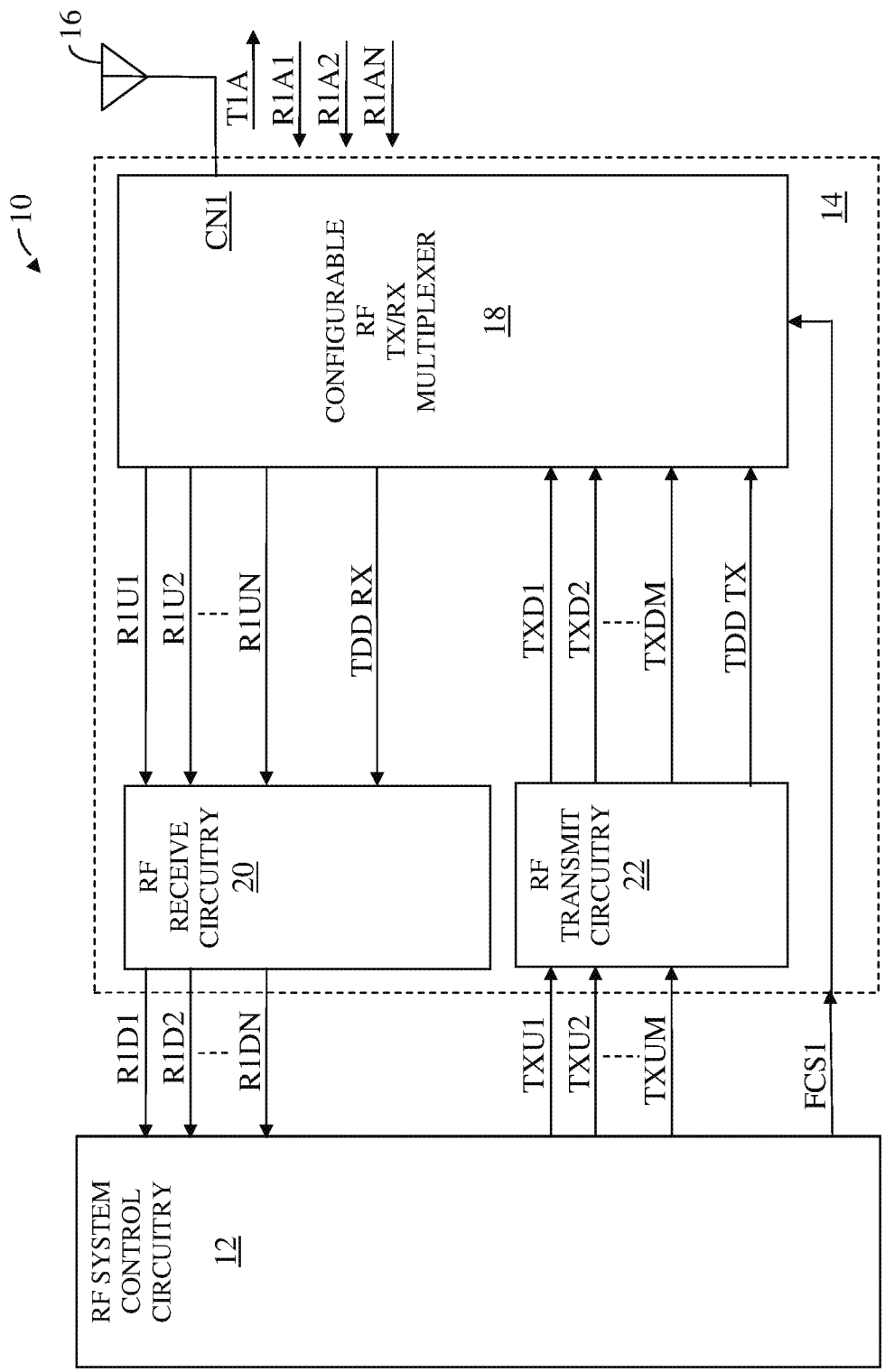
FIG. 14 shows the RF communications circuitry according to one embodiment of the RF communications circuitry.

FIG. 14 shows the RF communications circuitry 10 according to one embodiment of the RF communications circuitry 10. The RF communications circuitry 10 illustrated in FIG. 14 is similar to the RF communications circuitry illustrated in FIG. 1, except in the RF communications circuitry 10 illustrated in FIG. 14; during the TDD transmit mode, the RF transmit circuitry 22 provides the TDD TX signal TDD TX to the configurable RF TX/RX multiplexer 18; and during the TDD receive mode, the configurable RF TX/RX multiplexer 18 provides the TDD RX signal TDD RX to the RF receive circuitry 20.

Figure 15:
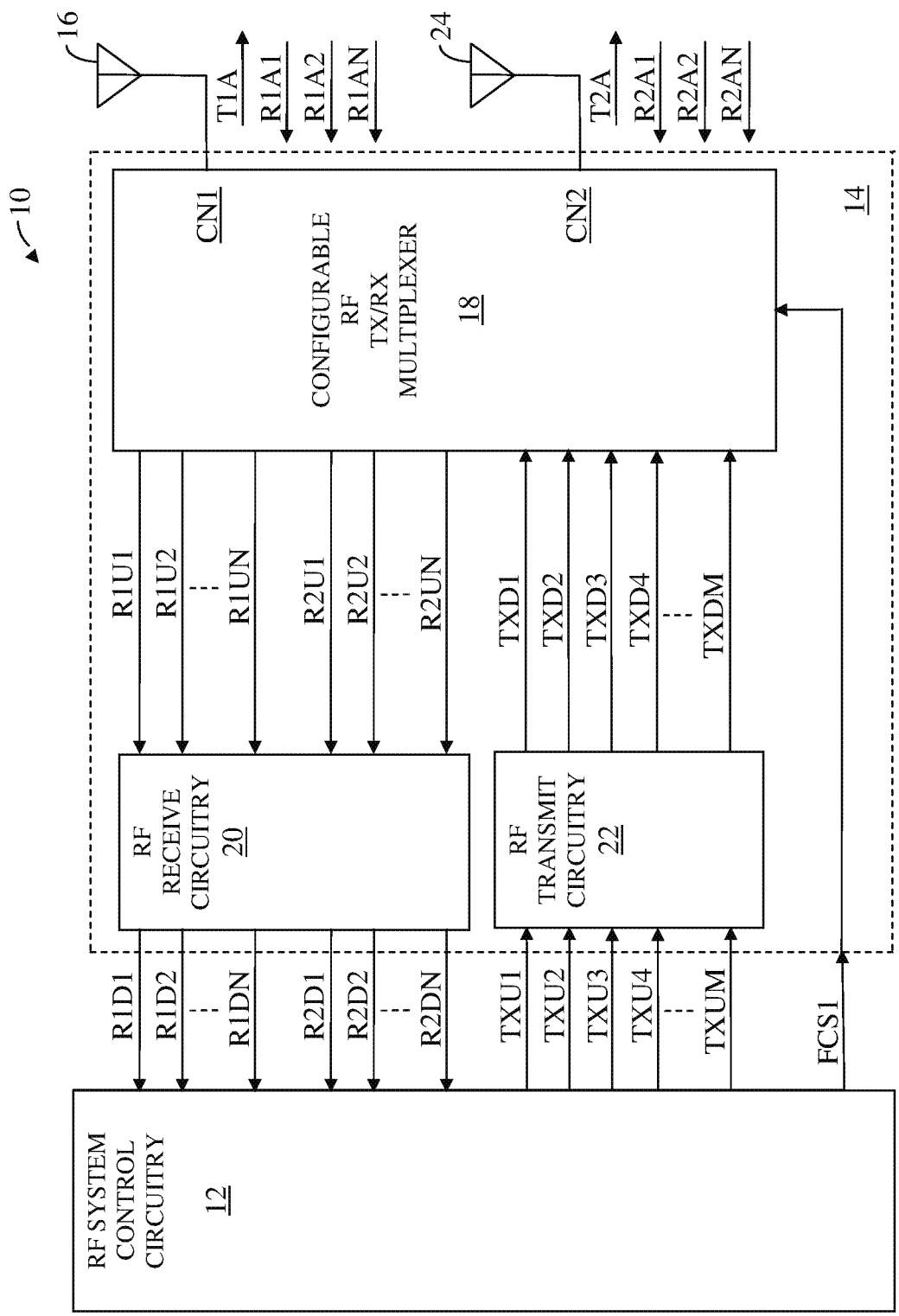
FIG. 15 shows the RF communications circuitry according to an alternate embodiment of the RF communications circuitry.

FIG. 15 shows the RF communications circuitry 10 according to an alternate embodiment of the RF communications circuitry 10. The RF communications circuitry 10 illustrated in FIG. 15 is similar to the RF communications circuitry 10 illustrated in FIG. 2, except in the RF communications circuitry 10 illustrated in FIG. 15, the RF system control circuitry 12 provides the first upstream RF transmit signal TXU1, the second upstream RF transmit signal TXU2, a third upstream RF transmit signal TXU3, a fourth upstream RF transmit signal TXU4, and up to and including an $M^{TH}$ upstream RF transmit signal TXUM to the RF transmit circuitry 22. In general, the RF system control circuitry 12 provides a group of upstream RF transmit signals TXU1, TXU2, TXU3, TXU4, TXUM to the RF transmit circuitry 22.

The RF transmit circuitry 22 processes the first upstream RF transmit signal TXU1 to provide the first downstream RF transmit signal TXD1 to the configurable RF TX/RX multiplexer 18, the second upstream RF transmit signal TXU2 to provide the second downstream RF transmit signal TXD2 to the configurable RF TX/RX multiplexer 18, the third upstream RF transmit signal TXU3 to provide a third downstream RF transmit signal TXD3 to the configurable RF TX/AX multiplexer 18, the fourth upstream RF transmit signal TXU4 to provide a fourth downstream RF transmit signal TXD4 to the configurable RF TX/RX multiplexer 18, and up to and including the $M^{TH}$ upstream RF transmit signal TXUM to provide the $M^{TH}$ downstream RF transmit signal TXDM to the configurable RF TX/RX multiplexer 18. In general, the RF transmit circuitry 22 provides a group of downstream RF transmit signals TXD1, TXD2, TXD3, TXD4, TXDM to the configurable RF TX/RX multiplexer 18.

In one embodiment of the RF communications circuitry 10, any or all of the group of upstream RF transmit signals TXU1, TXD2, TXU3, TXD4, TXUM, and any or all of the group of downstream RF transmit signals TXD1, TXD2, TXD3, TXD4, TXDM are omitted.

In one embodiment of the RF system control circuitry 12, the RF system control circuitry 12 selects one of the group of downstream RF transmit signals TXD1, TXD2, TXD3, TXD4, TXDM using the first function configuration signal FCS1, such that the configurable RF TX/RX multiplexer 18 processes and forwards the selected one of the group of downstream RF transmit signals TXD1, TXD2, TXD3, TXD4, TXDM to a selected one of the first common connection node CN1 and the second common connection node CN2.

If the selected one of the first common connection node CN1 and the second common connection node CN2 is the first common connection node CN1, then the configurable RF TX/RX multiplexer 18 processes and forwards the selected one of the group of downstream RF transmit signals TXD1, TXD2, TXD3, TXD4, TXDM to provide the first RF antenna transmit signal T1A, which is transmitted via the first RF antenna 16. If the selected one of the first common connection node CN1 and the second common connection node CN2 is the second common connection node CN2, then the configurable RF TX/RX multiplexer 18 processes and forwards the selected one of the group of downstream RF transmit signals TXD1, TXD2, TXD3, TXD4, TXDM to provide the second RF antenna transmit signal T2A, which is transmitted via the second RF antenna 24.

In one embodiment of the RF communications circuitry 10, the RF system control circuitry 12 selects one of the group of downstream RF transmit signals TXD1, TXD2, TXD3, TXD4, TXDM using the first function configuration signal FCS1, such that the configurable RF TX/RX multiplexer 18 filters and forwards the selected one of the group of downstream RF transmit signals TXD1, TXD2, TXD3, TXD4, TXDM to either the first RF antenna 16 or the second RF antenna 24 based on the first function configuration signal FCS1.

In one embodiment of the configurable RF TX/RX multiplexer 18, the configurable RF TX/RX multiplexer 18 receives and processes any or all of the group of first antenna, RF receive signals R1A1, R1A2, R1AN via the first RF antenna 16 from the first common connection node CN1 to provide any or all of the group of first antenna, upstream RF receive signals R1U1, R1U2, R1UN using the first group 28 (FIG. 16) of RF RX bandpass filters. In one embodiment of the any or all of the group of first antenna, upstream RF receive signals R1U1, R1U2, R1UN, the any or all of the group of first antenna, upstream RF receive signals R1U1, R1U2, R1UN are RXDLCA signals.

Figure 16:
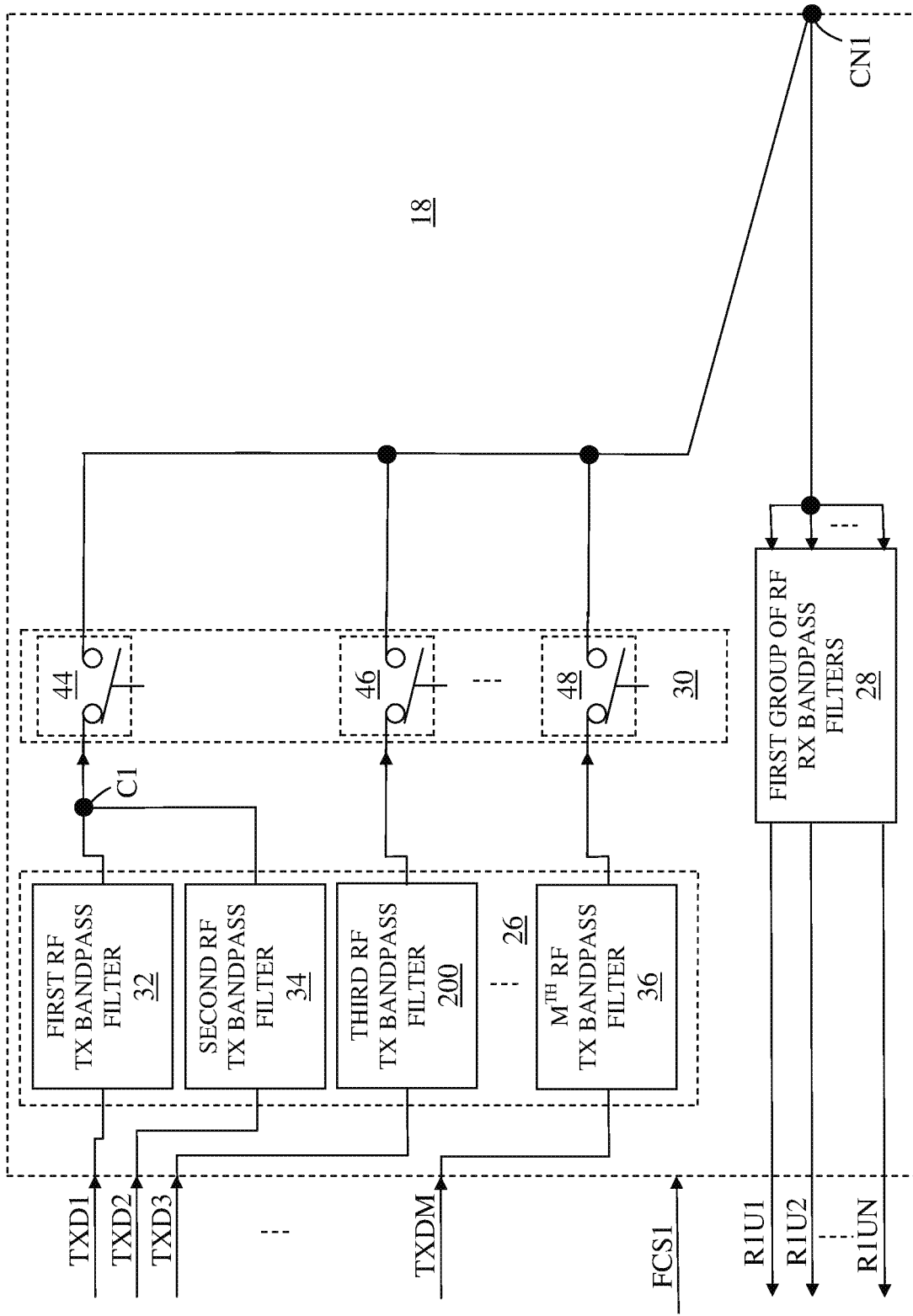
FIG. 16 shows the configurable RF TX/RX multiplexer illustrated in FIG. 15 according to one embodiment of the configurable RF TX/RX multiplexer.

FIG. 16 shows the configurable RF TX/RX multiplexer 18 illustrated in FIG. 15 according to one embodiment of the configurable RF TX/RX multiplexer 18. The configurable RF TX/RX multiplexer 18 illustrated in FIG. 16 is similar to the configurable RF TX/RX multiplexer 18 illustrated in FIG. 3, except in the configurable RF TX/RX multiplexer 18 illustrated in FIG. 16, the group 26 of RF TX bandpass filters further includes a third RF TX bandpass filter 200. Additionally, instead of the first antenna second RF TX switching element 46 being coupled between the second RF TX bandpass filter 34 and the first common connection node CN1, as illustrated in FIG. 3, the first antenna second RF TX switching element 46 is coupled between the third RF TX bandpass filter 200 and the first common connection node CN1, as illustrated in FIG. 16. Since the configurable RF TX/RX multiplexer 18 includes RE switching elements, in one embodiment of the configurable RF TX/RX multiplexer 18, the configurable RF TX/RX multiplexer 18 is a switchable RF TX/RX multiplexer.

Further, the first RF TX bandpass filter 32 is coupled to a first filter connection node C1 and the second RF TX bandpass filter 34 is coupled to the first filter connection node C1. The first antenna first RF TX switching element 44 is coupled between the first filter connection node C1 and the first common connection node CN1, which is coupled to the first RF antenna 16 (FIG. 15). The third RF TX bandpass filter 200 receives and filters the third downstream RF transmit signal TXD3.

Figure 17:
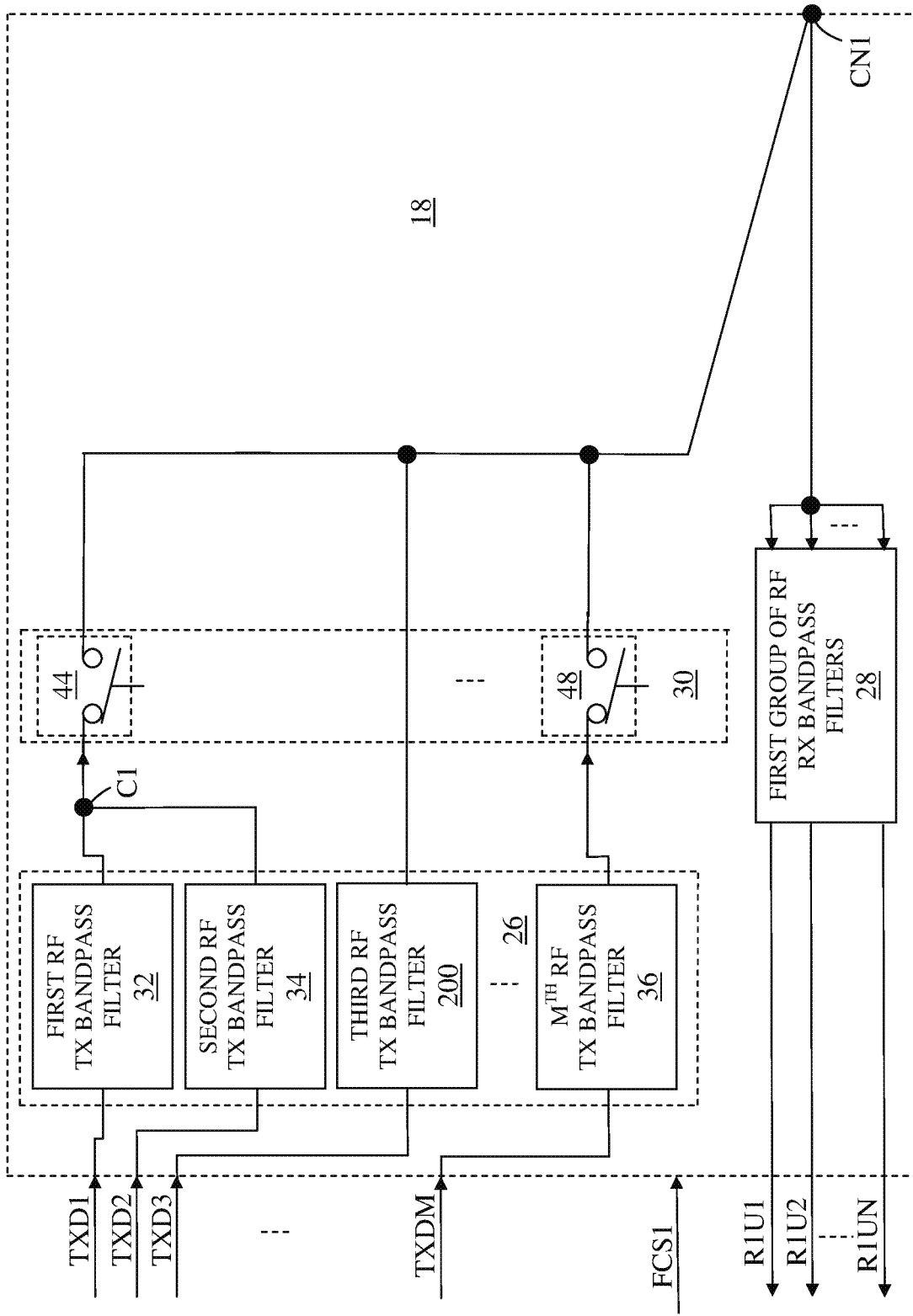
FIG. 17 shows the configurable RF TX/RX multiplexer illustrated in FIG. 15 according to an alternate embodiment of the configurable RF TX/RX multiplexer.

FIG. 17 shows the configurable RF TX/RX multiplexer 18 illustrated in FIG. 15 according to an alternate embodiment of the configurable RF TX/RX multiplexer 18. The configurable RF TX/RX multiplexer 18 illustrated in FIG. 17 is similar to the configurable RF TX/RX multiplexer 18 illustrated in FIG. 16, except in the configurable RF TX/RX multiplexer 18 illustrated in FIG. 17, the first antenna second RF TX switching element 46 is omitted, such that the third RF TX bandpass filter 200 is coupled to the first common connection node CN1. In one embodiment of the configurable RF TX/RX multiplexer 18, the RF TX bandpass filter 200 is directly coupled to the first common connection node CN1.

Figure 18:
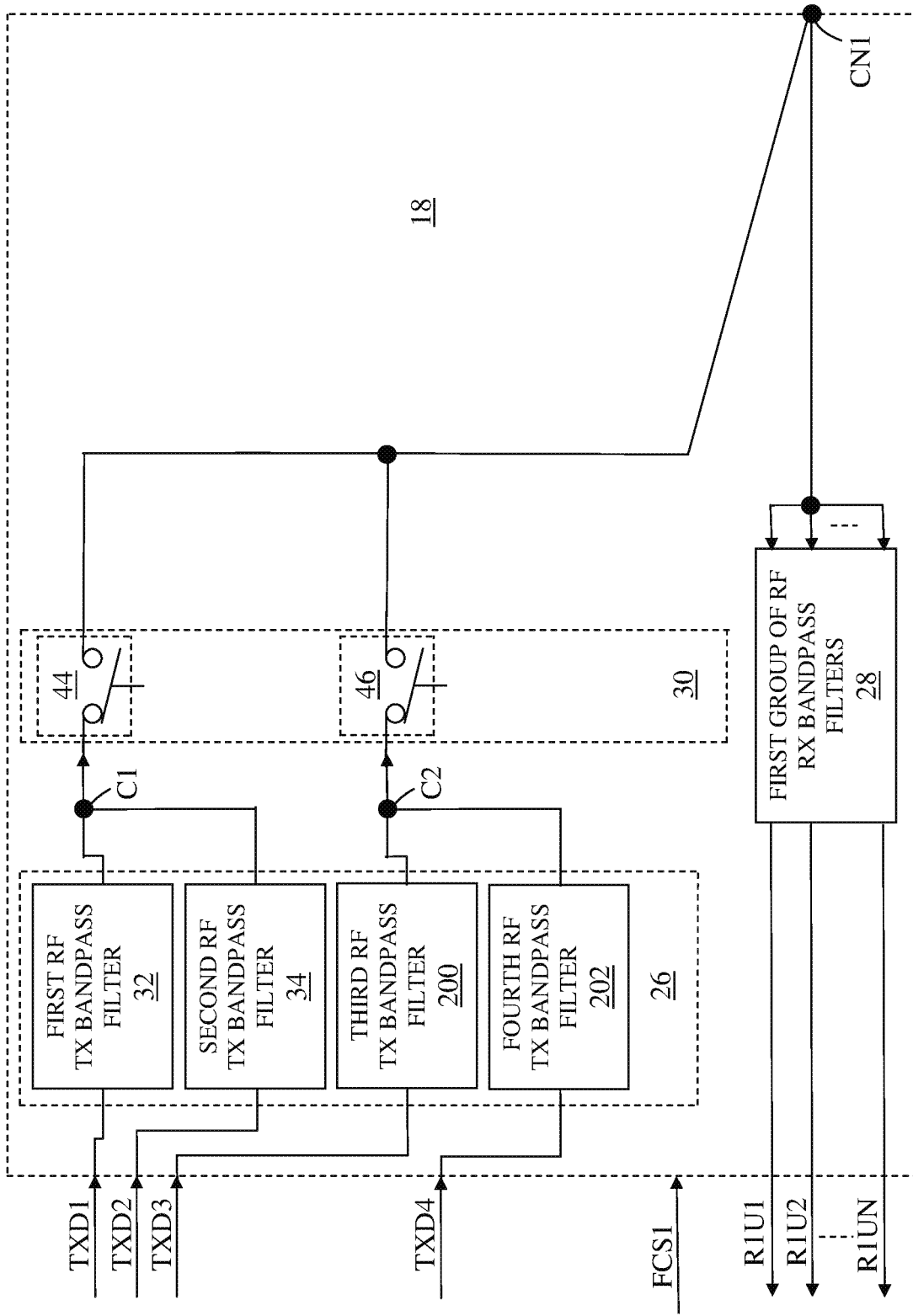
FIG. 18 shows the configurable RF TX/RX multiplexer illustrated in FIG. 15 according to an additional embodiment of the configurable RF TX/RX multiplexer.

FIG. 18 shows the configurable RF TX/RX multiplexer 18 illustrated in FIG. 15 according to an additional embodiment of the configurable RF TX/RX multiplexer 18. The configurable RF TX/RX multiplexer 18 illustrated in FIG. 18 is similar to the configurable RF TX/RX multiplexer 18 illustrated in FIG. 16, except in the configurable RF TX/RX multiplexer 18 illustrated in FIG. 18, the first antenna Mm RF TX switching element 48 is omitted, the $M^{TH}$ RF TX bandpass filter 36 is omitted, and the group 26 of RF TX bandpass filters further includes a fourth RF TX bandpass filter 202.

Further, the third RF TX bandpass filter 200 is coupled to a second filter connection node C2 and the fourth RF TX bandpass filter 202 is coupled to the second filter connection node C2. The first antenna second RF TX switching element 46 is coupled between the second filter connection node C2 and the first common connection node CN1, which is coupled to the first RF antenna 16 (FIG. 15). The fourth RF TX bandpass filter 202 receives and filters the fourth downstream RF transmit signal TXD4.

Figure 19:
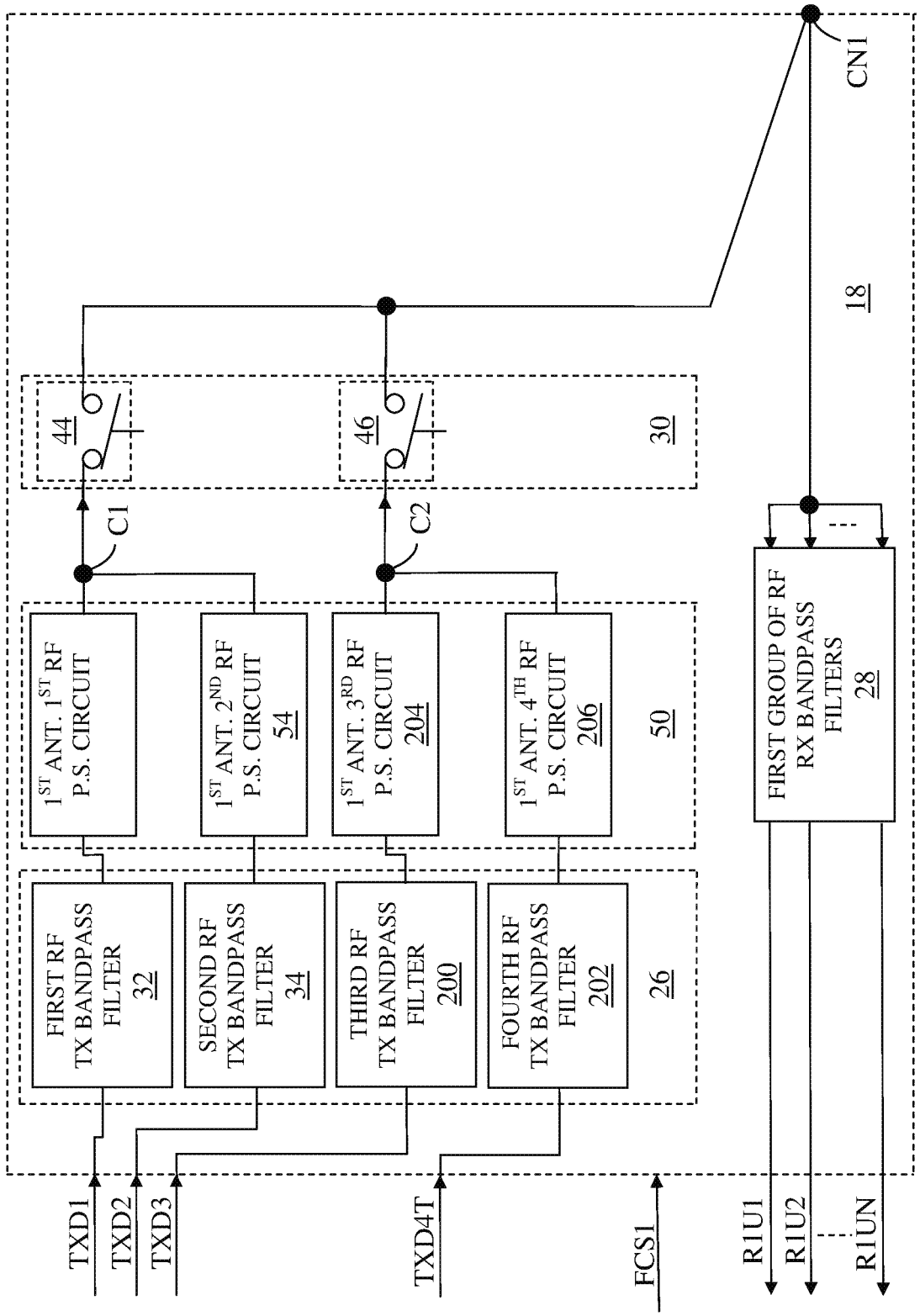
FIG. 19 shows the configurable RF TX/RX multiplexer illustrated in FIG. 15 according to another embodiment of the configurable RF TX/RX multiplexer.

FIG. 19 shows the configurable RF TX/RX multiplexer 18 illustrated in FIG. 15 according to another embodiment of the configurable RF TX/RX multiplexer 18. The configurable RF TX/RX multiplexer 18 illustrated in FIG. 19 is similar to the configurable RF TX/RX multiplexer 18 illustrated in FIG. 18, except in the configurable RF TX/RX multiplexer 18 illustrated in FIG. 19, the configurable RF TX/RX multiplexer 18 further includes the first group 50 of RF phase-shifting circuits, which includes the first antenna first RF phase-shifting circuit 52, the first antenna second RF phase-shifting circuit 54, a first antenna third RF phase-shifting circuit 204, and a first antenna fourth RF phase-shifting circuit 206.

The first antenna first RF phase-shifting circuit 52 is coupled between the first RE TX bandpass filter 32 and the first filter connection node C1. The first antenna second RF phase-shifting circuit 54 is coupled between the second RF TX bandpass filter 34 and the first filter connection node C1. The first antenna third RF phase-shifting circuit 204 is coupled between the third RF TX bandpass filter 200 and the second filter connection node C2. The first antenna fourth RF phase-shifting circuit 206 is coupled between the fourth RF TX bandpass filter 202 and the second filter connection node C2.

Figure 20:
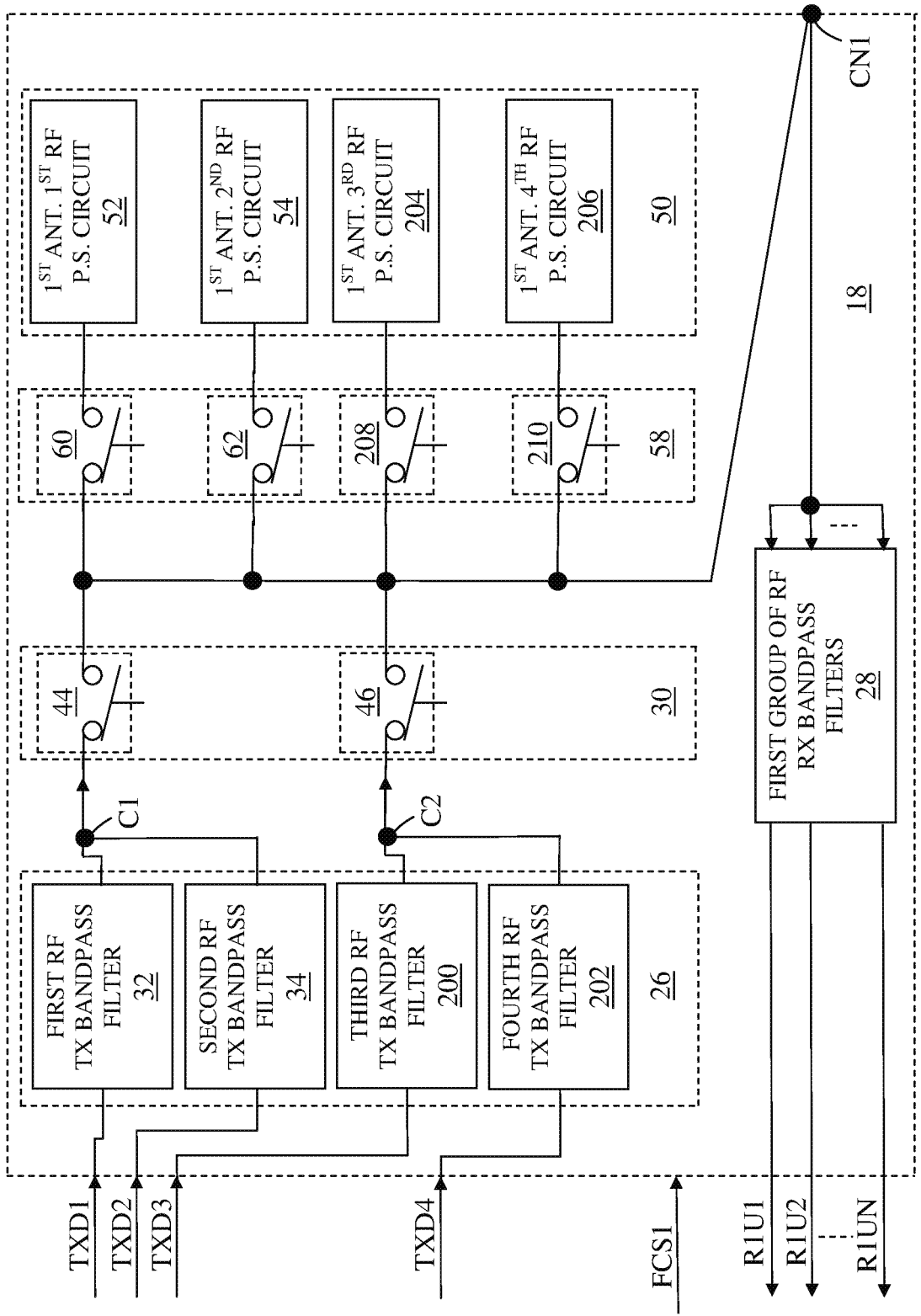
FIG. 20 shows the configurable RF TX/RX multiplexer illustrated in FIG. 15 according to a further embodiment of the configurable RF TX/RX multiplexer.

FIG. 20 shows the configurable RF TX/RX multiplexer 18 illustrated in FIG. 15 according to a further embodiment of the configurable RF TX/RX multiplexer 18. The configurable RF TX/RX multiplexer 18 illustrated in FIG. 20 is similar to the configurable RF TX/RX multiplexer 18 illustrated in FIG. 18, except in the configurable RF TX/RX multiplexer 18 illustrated in FIG. 20, the configurable RF TX/RX multiplexer 18 further includes the first group 50 of RF phase-shifting circuits and the first group 58 of phase-shift switching elements.

The first group 50 of RF phase-shifting circuits includes the first antenna first RF phase-shifting circuit 52, the first antenna second RF phase-shifting circuit 54, the first antenna third RE phase-shifting circuit 204, and the first antenna fourth RE phase-shifting circuit 206. The first group 58 of phase-shift switching elements includes the first antenna first phase-shift switching element 60, the first antenna second phase-shift switching element 62, a first antenna third phase-shift switching element 208, and a first antenna fourth phase-shift switching element 210.

The first antenna first phase-shift switching element 60 is coupled between the first antenna first RF phase-shifting circuit 52 and the first common connection node CN1 The first antenna second phase-shift switching element 62 is coupled between the first antenna second RF phase-shifting circuit 54 and the first common connection node CN1. The first antenna third phase-shift switching element 208 is coupled between the first antenna third RF phase-shifting circuit 204 and the first common connection node CN1 The first antenna fourth phase-shift switching element 210 is coupled between the first antenna fourth RF phase-shifting circuit 206 and the first common connection node CN1.

In general, each of the first group 58 of phase-shift switching elements is coupled between a corresponding one of the first group 50 of RF phase-shifting circuits and the first common connection node CN1.

Figure 21:
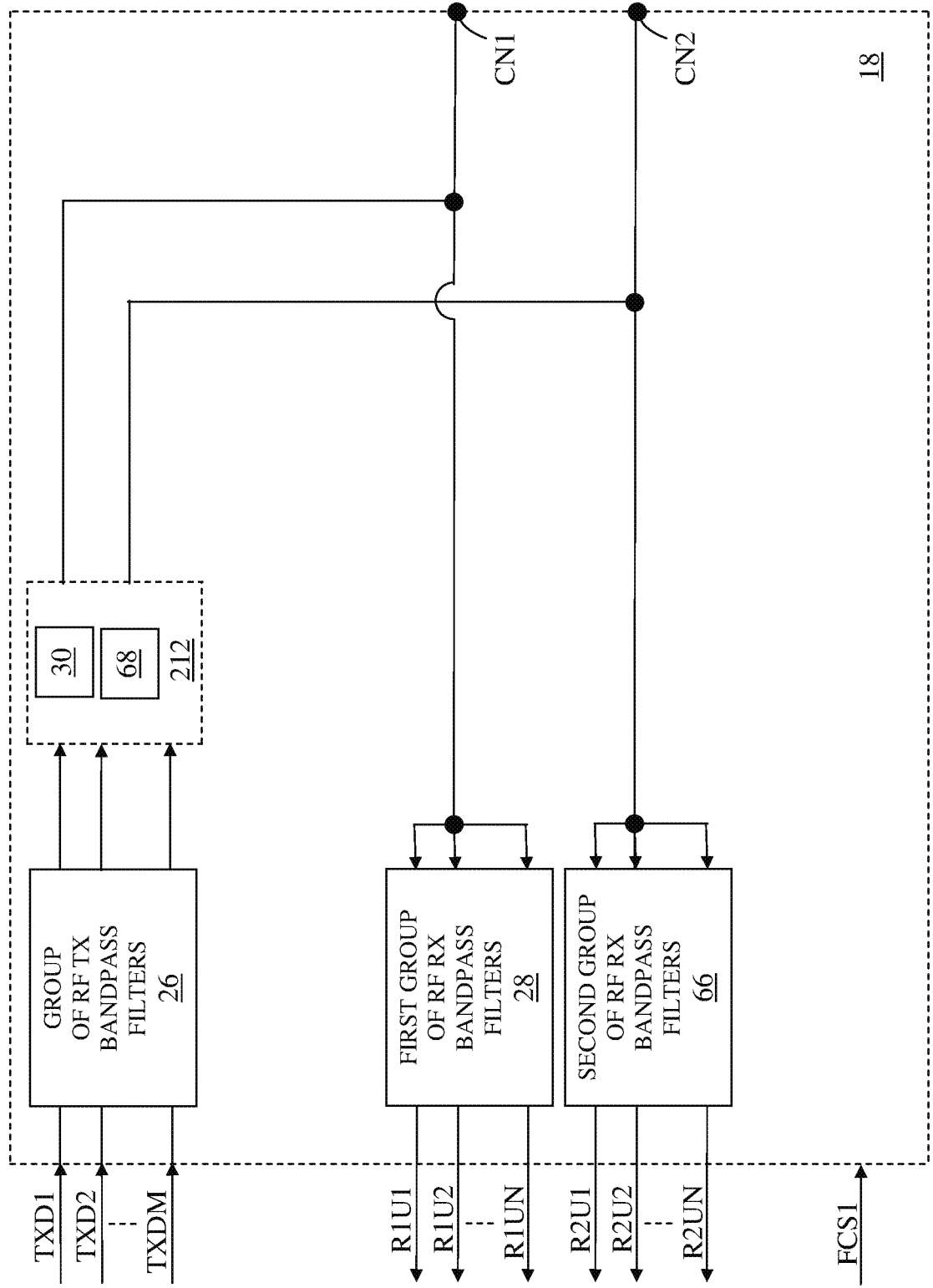
FIG. 21 shows the configurable RF TX/RX multiplexer illustrated in FIG. 15 according to a supplemental embodiment of the configurable RF TX/RX multiplexer.

FIG. 21 shows details of the configurable RF TX/RX multiplexer 18 illustrated in FIG. 15 according to a supplemental embodiment of the configurable RF TX/RX multiplexer 18. The configurable RF TX/RX multiplexer 18 includes the group 26 of RF TX bandpass filters, the first group 28 of RF RX bandpass filters, the second group 66 of RF RX bandpass filters, and a group 212 of multiple antenna RF TX switching elements. The group 212 of multiple antenna RF TX switching elements includes the first group 30 of RF TX switching elements and the second group 68 of RF TX switching elements.

The group 212 of multiple antenna RF TX switching elements is coupled between the group 26 of RF TX bandpass filters and the first common connection node CN1, and the group 212 of multiple antenna RF TX switching elements is further coupled between the group 26 of RF TX bandpass filters and the second common connection node CN2. The first group 28 of RF RX bandpass filters is coupled to the first common connection node CN1. The second group 66 of RF RX bandpass filters is coupled to the second common connection node CN2.

The configurable RF TX/RX multiplexer 18 receives and processes any or all of the group of first antenna, RF receive signals R1A1, R1A2, R1AN (FIG. 15) via the first RF antenna 16 to provide a corresponding any or all of the group of first antenna, upstream RF receive signals R1U1, R1U2, R1UN (FIG. 15) using the first group 28 of RF RX bandpass filters.

The configurable RF TX/RX multiplexer 18 receives and processes any or all of the group of second antenna, RF receive signals R2A1, R2A2, R2AN (FIG. 15) via the second RF antenna 24 to provide a corresponding any or all of the group of second antenna, upstream RF receive signals R2U1, R2U2, R2UN (FIG. 15) using the second group 66 of RF RX bandpass filters.

Figure 22:
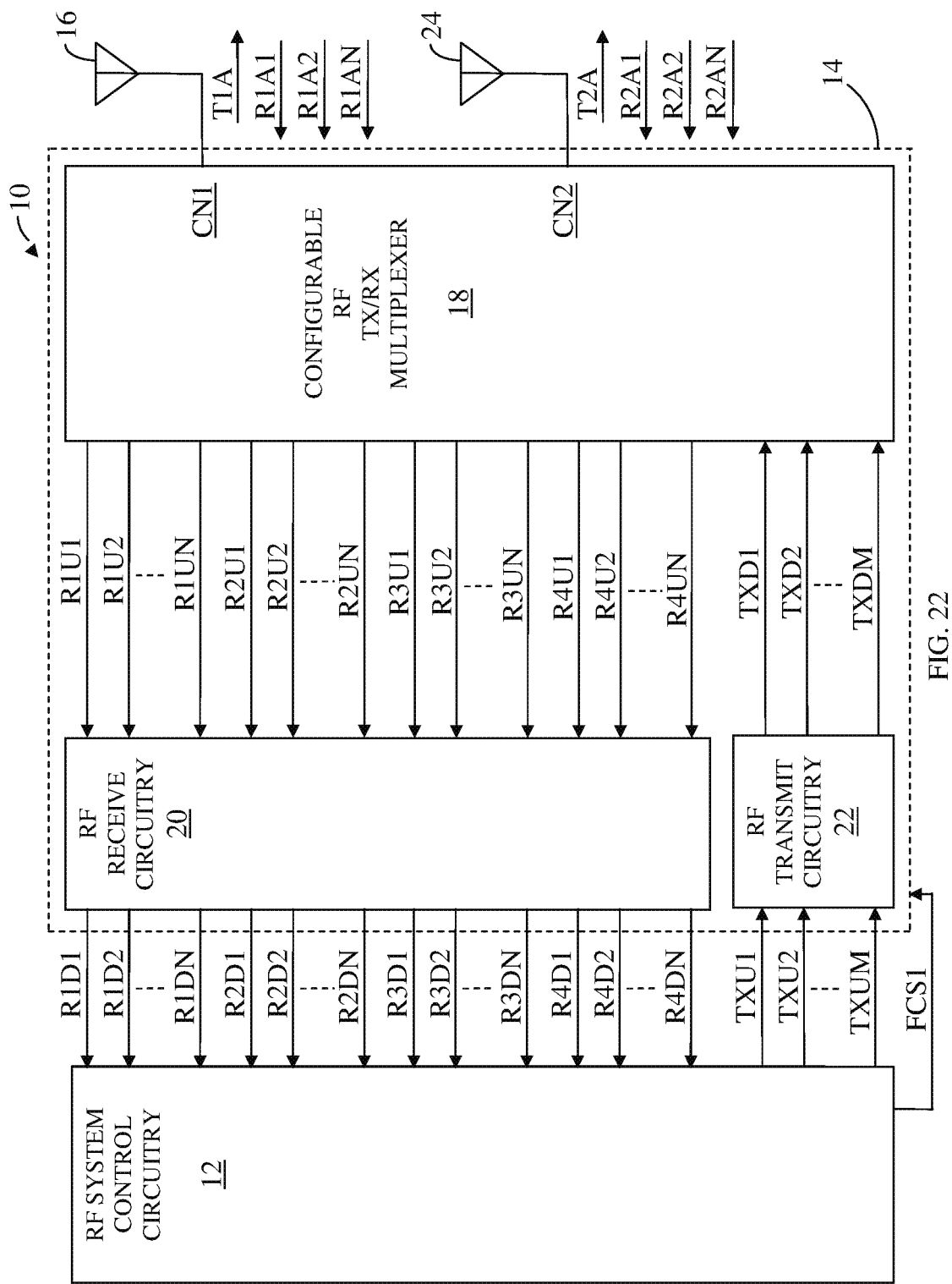
FIG. 22 shows the RF communications circuitry according to an additional embodiment of the RF communications circuitry.

FIG. 22 shows the RF communications circuitry 10 according to an additional embodiment of the RF communications circuitry 10, The RF communications circuitry 10 illustrated in FIG. 22 is similar to the RF communications circuitry 10 illustrated in FIG. 15, except in the RF communications circuitry 10 illustrated in FIG. 22, the configurable RF TX/RX multiplexer 18 further provides any or all of a third antenna, first upstream RF receive signal R3U1, a third antenna, second upstream RF receive signal R3U2, and up to and including a third antenna, $N^{TH}$ upstream RF receive signal R3UN. In general, the configurable RF TX/RX multiplexer 18 provides any or all of a group of third antenna, upstream RF receive signals R3U1, R3U2, R3UN to the RF receive circuitry 20.

In one embodiment of the RF receive circuitry 20, the RF receive circuitry 20 receives and processes any or all of the group of the third antenna, upstream RF receive signals R3U1, R3U2, R3UN to provide a corresponding any or all of a group of third antenna, downstream RF receive signals R3D1, R3D2, R3DN to the RF system control circuitry 12.

Additionally, the configurable RF TX/RX multiplexer 18 further provides any or all of a fourth antenna, first upstream RF receive signal R4U1, a fourth antenna, second upstream RF receive signal R4U2, and up to and including a fourth antenna, $N^{TH}$ upstream RF receive signal R4UN. In general, the configurable RF TX/RX multiplexer 18 provides any or all of a group of fourth antenna, upstream RF receive signals R4U1, R4U2, R4UN to the RF receive circuitry 20.

In one embodiment of the RF receive circuitry 20, the RF receive circuitry 20 receives and processes any or all of the group of the fourth antenna, upstream RF receive signals R4U1, R4U2, R4UN to provide a corresponding any or all of a group of first antenna, downstream RF receive signals R4D1, R4D2, R4DN to the RF system control circuitry 12.

Figure 23:
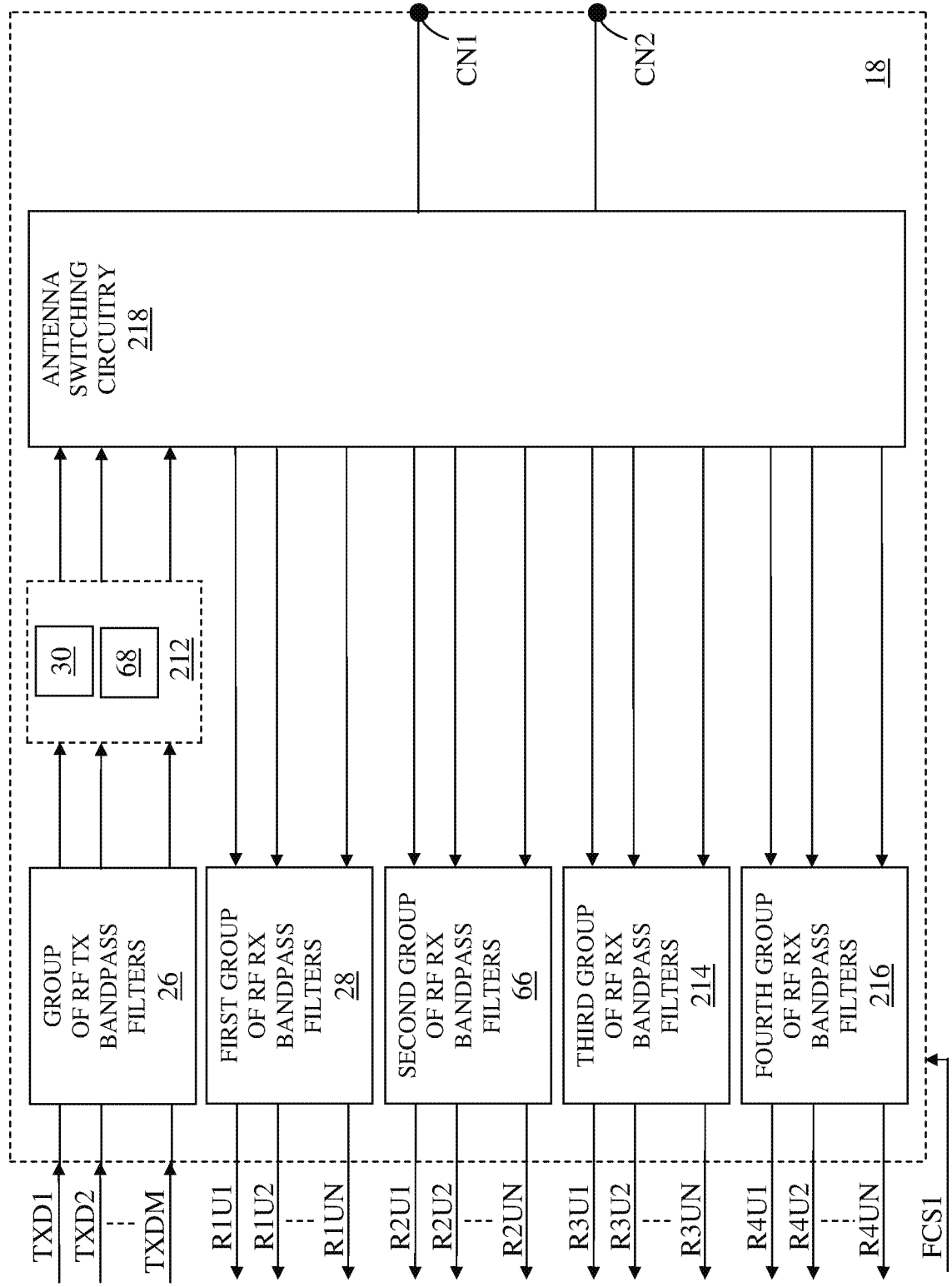
FIG. 23 shows the configurable RF TX/RX multiplexer illustrated in FIG. 22 according to one embodiment of the configurable RF TX/RX multiplexer.

FIG. 23 shows the configurable RF TX/RX multiplexer 18 illustrated in FIG. 22 according to one embodiment of the configurable RF TX/RX multiplexer 18. The configurable RF TX/RX multiplexer 18 illustrated in FIG. 23 is similar to the configurable RF TX/RX multiplexer 18 illustrated in FIG. 21, except the configurable RF TX/RX multiplexer 18 illustrated in FIG. 23 further includes a third group 214 of RF RX bandpass filters, a fourth group 216 of RF RX bandpass filters, and antenna switching circuitry 218.

In one embodiment of the configurable RF TX/RX multiplexer 18, the antenna switching circuitry 218 is coupled between the first common connection node CN1 and the group 212 of multiple antenna RF TX switching elements. In one embodiment of the configurable RF TX/RX multiplexer 18, the antenna switching circuitry 218 is coupled between the first common connection node CN1 and the first group 28 of RF RX bandpass filters. In one embodiment of the configurable RF TX/RX multiplexer 18, the antenna switching circuitry 218 is coupled between the first common connection node CN1 and the second group 66 of RF RX bandpass filters. In one embodiment of the configurable RF TX/RX multiplexer 18, the antenna switching circuitry 218 is coupled between the first common connection node CN1 and the third group 214 of RF RX bandpass filters. In one embodiment of the configurable RF TX/RX multiplexer 18, the antenna switching circuitry 218 is coupled between the first common connection node CN1 and the fourth group 216 of RF RX bandpass filters.

In one embodiment of the configurable RF TX/RX multiplexer 18, the antenna switching circuitry 218 is coupled between the second common connection node CN2 and the group 212 of multiple antenna RF TX switching elements. In one embodiment of the configurable RF TX/RX multiplexer 18, the antenna switching circuitry 218 is coupled between the second common connection node CN2 and the first group 28 of RF RX bandpass filters. In one embodiment of the configurable RF TX/RX multiplexer 18, the antenna switching circuitry 218 is coupled between the second common connection node CN2 and the second group 66 of RF RX bandpass filters. In one embodiment of the configurable RF TX/RX multiplexer 18, the antenna switching circuitry 218 is coupled between the second common connection node CN2 and the third group 214 of RF RX bandpass filters. In one embodiment of the configurable RF TX/RX multiplexer 18, the antenna switching circuitry 218 is coupled between the second common connection node CN2 and the fourth group 216 of RF RX bandpass filters.

In one embodiment of the configurable RF TX/RX multiplexer 18, the RF system control circuitry 12 (FIG. 22) selects connectivity of the antenna switching circuitry 218 using the first function configuration signal FCS1. In one embodiment of the configurable RF TX/RX multiplexer 18, each of the first group 28 of RF RX bandpass filters is coupled to the first common connection node CN1 via the antenna switching circuitry 218. In one embodiment of the configurable RF TX/RX multiplexer 18, each of the first group 28 of RF RX bandpass filters is coupled to the second common connection node CN2 via the antenna, switching circuitry 218. In one embodiment of the configurable RF TX/RX multiplexer 18, the antenna switching circuitry 218 is coupled between the first antenna first RF TX switching element 44 (FIG. 20) and the first common connection node CN1.

In one embodiment of the configurable RF TX/RX multiplexer 18, the RF system control circuitry 12 (FIG. 22) selects connectivity of the antenna switching circuitry 218 between the first common connection node CN1 and the first group 28 of RF RX bandpass filters using the first function configuration signal FCS1. In one embodiment of the configurable RF TX/RX multiplexer 18, the RF system control circuitry 12 (FIG. 22) selects connectivity of the antenna switching circuitry 218 between the First common connection node CN1 and the first group 30 of RF TX switching elements using the first function configuration signal FCS1.

In one embodiment of the configurable RF TX/RX multiplexer 18, the antenna switching circuitry 218 is coupled between the first common connection node CN1 and the first group 30 of RF TX switching elements. In one embodiment of the configurable RF TX/RX multiplexer 18, the antenna switching circuitry 218 is coupled between the first common connection node CN1 and the second group 68 of RF TX switching elements.

In one embodiment of the configurable RF TX/RX multiplexer 18, the antenna switching circuitry 218 is coupled between the second common connection node CN2 and the first group 30 of RF TX switching elements. In one embodiment of the configurable RE TX/RX multiplexer 18, the antenna switching circuitry 218 is coupled between the second common connection node CN2 and the second group 68 of RF TX switching elements.

In one embodiment of the configurable RF TX/RX multiplexer 18, a passband of each of the first group 28 of RF RX bandpass filters is essentially equivalent to a corresponding passband of each of the second group 66 of RF RX bandpass filters. In one embodiment of the configurable RF TX/RX multiplexer 18, a passband of each of the third group 214 of RF RX bandpass filters is essentially equivalent to a corresponding passband of each of the fourth group 216 of RF RX bandpass filters.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:
1. A switchable radio frequency (RF) transmit/receive (TX/RX) multiplexer comprising:
  a first common connection node coupled directly to a first RF antenna;
  a second common connection node coupled directly to a second RF antenna;
  a plurality of RF TX bandpass filters;
  a plurality of first RF TX switching elements each coupled between the first common connection node and a respective one of the plurality of RF TX bandpass filters;

a plurality of second RF TX switching elements each coupled between the second common connection node and a respective one of the plurality of RF TX bandpass filters;

a plurality of first RF RX bandpass filters each coupled to the first common connection node without any intervening switching element; and a plurality of second RF RX bandpass filters each coupled to the second common connection node without any intervening switching element.

2. The switchable RF TX/RX multiplexer of claim 1, further comprising a plurality of first RF phase-shifting circuits each coupled between a respective one of the plurality of first RF TX switching elements and a respective one of the plurality of RE TX bandpass filters.

3. The switchable RF TX/RX multiplexer of claim 2, wherein each of the plurality of first RF phase-shifting circuits is configured to cause the plurality of RF TX bandpass filters and the plurality of first RF RX bandpass filters to operate in full-duplex operation without interfering with one another.

4. The switchable RF TX/RX multiplexer of claim 1, further comprising a plurality of second RF phase-shifting circuits each coupled between a respective one of the plurality of second RF TX switching elements and a respective one of the plurality of RF TX bandpass filters.

5. The switchable RF TX/RX multiplexer of claim 1, further comprising:

a plurality of first RF phase-shifting circuits each coupled between a respective one of the plurality of first RF TX switching elements and a respective one of the plurality of RE TX bandpass filters; and a plurality of second RF phase-shifting circuits each coupled between a respective one of the plurality of second RF TX switching elements and a respective one of the plurality of RF TX bandpass filters.

6. Radio frequency (RE) communication circuitry comprising:

a switchable RF transmit/receive (TX/RX) multiplexer comprising:

a first common connection node coupled directly to a first RF antenna;

a second common connection node coupled directly to a second RF antenna;

a plurality of RF TX bandpass filters;

a plurality of first RF TX switching elements each coupled between the first common connection node and a respective one of the plurality of RE TX bandpass filters;

a plurality of second RF TX switching elements each coupled between the second common connection node and a respective one of the plurality of RF TX bandpass filters;

a plurality of first RF RX bandpass filters each coupled to the first common connection node without any intervening switching element; and a plurality of second RF RX bandpass filters each coupled to the second common connection node without any intervening switching element;

RF front-end circuitry comprising:

RF transmit circuitry coupled to the plurality of RF TX bandpass filters; and

RF receive circuitry coupled to the plurality of first RF RX bandpass filters and the plurality of second RF RX bandpass filters; and RF system control circuitry coupled to the RF transmit circuitry and the RF receive circuitry.

7. The RF communication circuitry of claim 6, wherein the switchable RF TX/RX multiplexer further comprises a plurality of first RF phase-shifting circuits each coupled between a respective one of the plurality of first RF TX switching elements and a respective one of the plurality of RF TX bandpass filters.

8. The RF communication circuitry of claim 7, wherein each of the plurality of first RF phase-shifting circuits is configured to cause the plurality of RF TX bandpass filters and the plurality of first RF RX bandpass filters to operate in full-duplex operation without interfering with one another.

9. The RF communication circuitry of claim 6, wherein the switchable RF TX/RX multiplexer further comprises a plurality of second RF phase-shifting circuits each coupled between a respective one of the plurality of second RF TX switching elements and a respective one of the plurality of RF TX bandpass filters.

10. The RF communication circuitry of claim 6, wherein the switchable RF TX/RX multiplexer further comprises:

a plurality of first RF phase-shifting circuits each coupled between a respective one of the plurality of first RF TX switching elements and a respective one of the plurality of RF TX bandpass filters; and a plurality of second RF phase-shifting circuits each coupled between a respective one of the plurality of second RF TX switching elements and a respective one of the plurality of RF TX bandpass filters.

11. The RF communication circuitry of claim 6, wherein the RF system control circuitry is configured to configure the switchable RF TX/RX multiplexer based on a function configuration signal.

12. The RF communication circuitry of claim 6, wherein:

the RF system control circuitry is configured to provide a plurality of upstream RF transmit signals to the RF transmit circuitry; and the RF transmit circuitry is configured to:

process each of the plurality of upstream RF transmit signals to generate a respective one of a plurality of downstream RF transmit signals; and provide the plurality of downstream RF transmit signals to the plurality of RF TX bandpass filters.

13. The RF communication circuitry of claim 12, wherein the RF system control circuitry is further configured to:

select one of the plurality of downstream RF transmit signals; and cause the switchable RF TX/RX multiplexer to forward the selected one of the plurality of downstream RF transmit signals to the first common connection node.

14. The RF communication circuitry of claim 6, wherein:

each of the plurality of first RF RX bandpass filters is configured to:

receive a respective one of a plurality of first RF receive signals via the first common connection node;

generate a respective one of a plurality of first upstream RF receive signals based on the respective one of the plurality of first RF receive signals; and provide the respective one of the plurality of first upstream RF receive signals to the RF receive circuitry; and each of the plurality of second RF RX bandpass filters is configured to:

receive a respective one of a plurality of second RF receive signals via the second common connection node;

generate a respective one of a plurality of second upstream RF receive signals based on the respective one of the plurality of second RF receive signals; and provide the respective one of the plurality of second upstream RF receive signals to the RF receive circuitry.

15. The RF communication circuitry of claim 14, wherein the RF receive circuitry is configured to;

receive the plurality of first upstream RF receive signals and the plurality of second upstream RF receive signals;

generate a respective one of a plurality of first downstream RF receive signals from each of the plurality of first upstream RF receive signals;

generate a respective one of a plurality of second downstream RF receive signals from each of the plurality of second upstream RF receive signals; and provide the plurality of first downstream RF receive signals and the plurality of second downstream RF receive signals to the RF system control circuitry.

* * * * *

UNITED STATES PATENT AND TRADEMARK OFFICE
CERTIFICATE OF CORRECTION

| | |
|---|---|
| PATENT NO. | : 12,107,619 B2 |
| APPLICATION NO. | : 18/355705 |
| DATED | : October 1, 2024 |
| INVENTOR(S) | : Nadim Khlat |

It is certified that error appears in the above-identified patent and that said Letters Patent is hereby corrected as shown below:

In the Specification

In Column 2, Line 23, replace "RE" with --RF--.

In Column 2, Line 31, replace "RE" with --RF--.

In Column 2, Line 32, replace "RE" with --RF--.

In Column 2, Line 43, replace "RE" with --RF--.

In Column 4, Line 37, replace "NIH" with --$N^{TH}$--.

In Column 4, Line 38, replace "MAN" with --R1AN--.

In Column 5, Line 63, replace "RE" with --RF--.

In Column 5, Line 65, replace "Nm" with --$N^{TH}$--.

In Column 6, Line 6, replace "RE" with --RF--.

In Column 8, Line 2, replace "hi" with --in--.

In Column 9, Line 23, replace "RE" with --RF--.

In Column 9, Line 43, replace "CN2," with --CN2.--.

In Column 9, Line 52, replace "RE" with --RF--.

In Column 9, Line 61, replace "RE" with --RF--.

Signed and Sealed this
Twenty-ninth Day of October, 2024

Katherine Kelly Vidal
*Director of the United States Patent and Trademark Office*

CERTIFICATE OF CORRECTION (continued)
U.S. Pat. No. 12,107,619 B2

In Column 10, Line 6, replace "RE" with --RF--.

In Column 10, Line 16, replace "RE" with --RF--.

In Column 10, Line 22, replace "RE" with --RF--.

In Column 10, Line 28, replace "Mm" with --$M^{TH}$--.

In Column 13, Line 1, replace "NIH" with --$N^{TH}$--.

In Column 13, Line 3, replace "RE" with --RF--.

In Column 13, Line 34, replace "hi" with --in--.

In Column 13, Line 55, replace "RE" with --RF--.

In Column 14, Line 35, replace "TOD" with --TDD--.

In Column 14, Line 49, replace "TOD" with --TDD--.

In Column 14, Line 53, replace "RF communications circuitry" with --RF communications circuitry 10--.

In Column 15, Line 17, replace "TX/AX" with --TX/RX--.

In Column 15, Line 30, replace "TXD2" with --TXU2--.

In Column 15, Line 30, replace "TXD4" with --TXU4--.

In Column 16, Line 28, replace "RE" with --RF--.

In Column 16, Line 60, replace "Mm" with --$M^{TH}$--.

In Column 17, Line 22, replace "RE" with --RF--.

In Column 17, Line 45, replace "RE" with --RF--.

In Column 17, Line 46, replace "RE" with --RF--.

In Column 17, Line 54, replace "CN1 The" with --CN1. The--.

In Column 17, Line 60, replace "CN1 The" with --CN1. The--.

In Column 20, Line 23, replace "RE" with --RF--.

CERTIFICATE OF CORRECTION (continued)
U.S. Pat. No. 12,107,619 B2

In the Claims

In Column 21, Line 15, replace "RE" with --RF--.

In Column 21, Line 32, replace "RE" with --RF--.

In Column 21, Line 37, replace "RE" with --RF--.

In Column 21, Line 48, replace "RE" with --RF--.

In Column 23, Line 8, replace "configured to;" with --configured to:--.